(12) United States Patent
Ichihara et al.

(10) Patent No.: US 9,224,622 B2
(45) Date of Patent: Dec. 29, 2015

(54) SEMICONDUCTOR DEVICE, METHOD OF MANUFACTURING THE DEVICE, AND LIQUID CRYSTAL DISPLAY

(71) Applicant: Renesas Electronics Corporation, Kawasaki-shi, Kanagawa (JP)

(72) Inventors: Seiichi Ichihara, Kawasaki (JP); Hisao Nakamura, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 156 days.

(21) Appl. No.: 13/668,893

(22) Filed: Nov. 5, 2012

(65) Prior Publication Data

US 2013/0120699 A1    May 16, 2013

(30) Foreign Application Priority Data

Nov. 11, 2011    (JP) .................................. 2011-247014

(51) Int. Cl.
*G02F 1/1345* (2006.01)
*H01L 21/56* (2006.01)
(Continued)

(52) U.S. Cl.
CPC .......... *H01L 21/568* (2013.01); *G02F 1/13452* (2013.01); *G02F 1/13454* (2013.01); *H01L 21/6836* (2013.01); *H01L 23/3114* (2013.01); *H01L 23/552* (2013.01); *H01L 21/561* (2013.01); *H01L 24/11* (2013.01); *H01L 24/14* (2013.01); *H01L 24/16* (2013.01); *H01L 24/27* (2013.01); *H01L 24/73* (2013.01); *H01L 2221/6834* (2013.01); *H01L 2221/68336* (2013.01); *H01L 2221/68386* (2013.01); *H01L 2224/11002* (2013.01); *H01L 2224/14155* (2013.01); *H01L 2224/16225* (2013.01); *H01L 2224/27002* (2013.01); *H01L 2224/73204* (2013.01); *H01L 2224/73253* (2013.01); *H01L 2924/1305* (2013.01); *H01L 2924/13091* (2013.01)

(58) Field of Classification Search
CPC ............ G02F 1/13452; G02F 1/13454; H01L 23/552; H01L 23/3114
USPC ......................................... 349/110, 149, 151
See application file for complete search history.

(56) References Cited

U.S. PATENT DOCUMENTS 6,304,736 B1 * 10/2001 Gomi et al. .................... 399/112
6,819,376 B1    11/2004 Muramatsu
(Continued)

FOREIGN PATENT DOCUMENTS

JP    6-112371 A        4/1994
JP    06112371 A *      4/1994
(Continued)

*Primary Examiner* — Michael Caley
(74) *Attorney, Agent, or Firm* — Foley & Lardner LLP

(57) ABSTRACT

In order to shield the light incident from the chip side surface or chip rear surface of a semiconductor chip that forms an LCD driver, a light-shielding film is formed over the chip side surface and chip rear surface of the semiconductor chip itself, not using a light-shielding tape that is a component separate from the semiconductor chip. Accordingly, the light-shielding tape as a separate component is not used, and hence the trouble that the light-shielding tape may protrude from the surface of a glass substrate whose thickness has been made small can be solved. As a result, the thinning of a liquid crystal display, and the subsequent thinning of the mobile phone in which the liquid crystal display is mounted can be promoted.

3 Claims, 23 Drawing Sheets

(51) Int. Cl.
*H01L 23/552* (2006.01)
*H01L 23/31* (2006.01)
*H01L 21/683* (2006.01)
*H01L 23/00* (2006.01)

(56) References Cited

U.S. PATENT DOCUMENTS

2004/0263725 A1* 12/2004 Muramatsu ............... 349/110
2007/0216001 A1* 9/2007 Nakamura ............... 257/678
2007/0278678 A1* 12/2007 Uchida ............... 257/738
2009/0127561 A1* 5/2009 Shiomi et al. ............... 257/66

FOREIGN PATENT DOCUMENTS

JP  2006-080284 A  3/2006
JP  2007-299015 A  11/2007

* cited by examiner

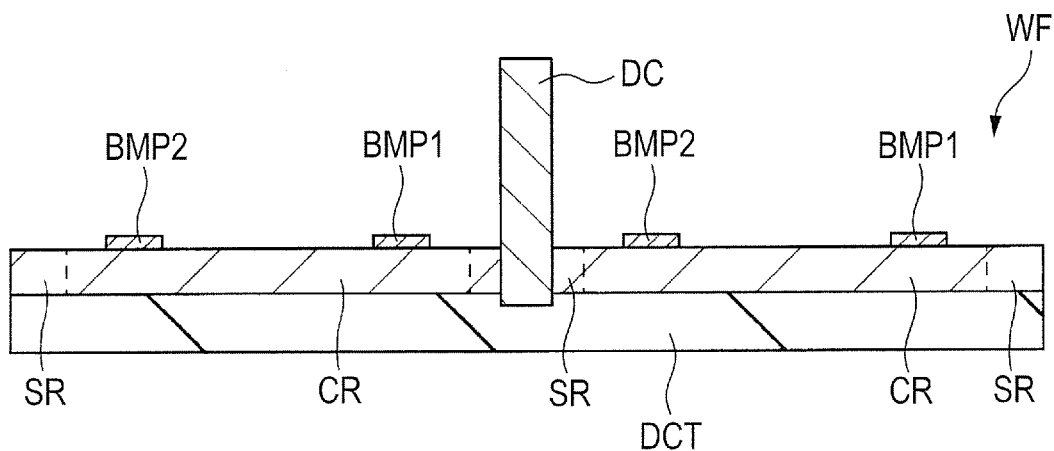
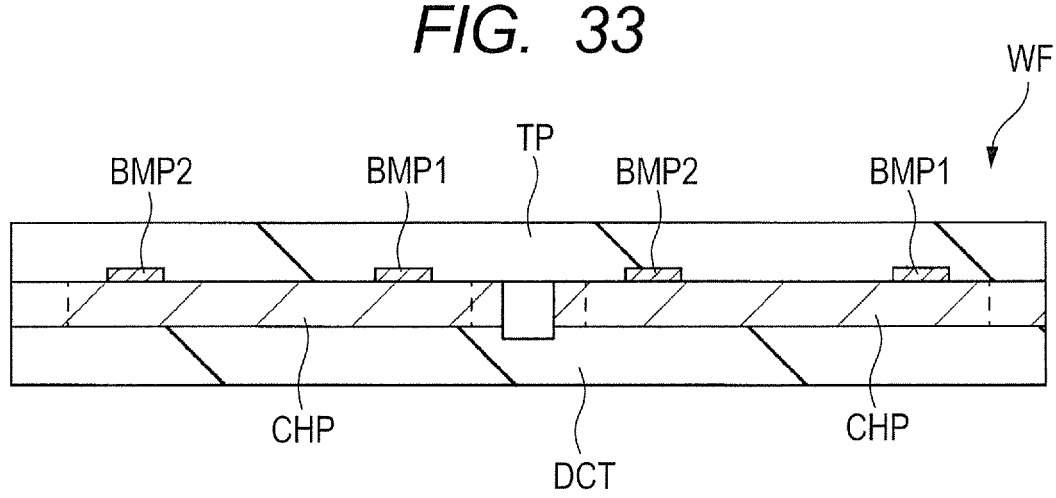

US 9,224,622 B2

SEMICONDUCTOR DEVICE, METHOD OF MANUFACTURING THE DEVICE, AND LIQUID CRYSTAL DISPLAY

CROSS-REFERENCE TO RELATED APPLICATIONS

The disclosure of Japanese Patent Application No. 2011-247014 filed on Nov. 11, 2011 including the specification, drawings and abstract is incorporated herein by reference in its entirety.

BACKGROUND

The present invention relates to a semiconductor device, a technique for manufacturing the device, and a liquid crystal display, and in particular, to a technique effectively applicable to a semiconductor device to be arranged in a case along with a light source.

A technique for shielding a semiconductor chip from light, which is arranged in a case along with a light source, by forming a light-shielding pressure-sensitive adhesive tape so as to cover the semiconductor chip is described in Japanese Unexamined Patent Publication No. Hei 06 (1994)-112371 (Patent Document 1).

SUMMARY

Flat panel displays, represented by liquid crystal displays, plasma displays, and organic EL displays, have become rapidly popular in recent years. In each of these flat panel displays, a semiconductor chip (driver IC) in which an integrated circuit for driving a display unit is formed is arranged in a case along with the display unit. Accordingly, there is the fear that, in the flat panel display, the light emitted from a light source may be emitted onto the semiconductor chip.

For example, in a liquid crystal display, a light source (back light) is arranged on the back (lower) side of a substrate (glass substrate) over which a semiconductor chip for driving a liquid crystal material (liquid crystal composition) is mounted, and light is emitted from the light source toward the liquid crystal material arranged on the upper side of the light source. In this case, there is the fear that the light may also be emitted onto the semiconductor chip. In a plasma display or an organic EL display, a display unit itself (light source) emits light, and hence there is the possibility that the light leaked out from the display unit may be emitted onto a semiconductor chip arranged to be adjacent to the display unit.

If light is emitted onto a semiconductor chip, as stated above, an output voltage from the semiconductor chip is decreased, and hence a voltage to be applied to a display unit is decreased. As a result, a trouble is caused, in which, for example, a displayed image becomes unclear (contrast is decreased).

Accordingly, it becomes effective to shield the semiconductor chip from light by covering the chip with a light-shielding pressure-sensitive adhesive tape as described, for example, in the aforementioned Patent Document 1.

However, the thinning of the flat panel displays has been promoted in recent years, and accordingly, not only the thickness of the semiconductor chips, but also the thickness of the substrates (cover glass, glass substrates, etc.) over which the semiconductor chips are to be arranged is in the tendency of being made small. Accordingly, there is the fear that, if the aforementioned light-shielding pressure-sensitive adhesive tape is used, the tape may protrude from the surface of the substrate (cover glass), depending on the thickness of the substrate or semiconductor chip. If the light-shielding pressure-sensitive adhesive tape protrudes, an impact (pressure) from outside is likely to be transmitted to the semiconductor chip via the tape and the case, thereby possibly causing a chip crack.

A purpose of the present invention is to provide a technique in which thinning of a flat panel display can be promoted.

The aforementioned and other purposes and new features of the present invention will become clear with reference to the description of the specification and accompanying drawings.

Of the inventions disclosed in this application, typical inventions can be briefly outlined as follows.

A method of manufacturing a semiconductor device according to a typical embodiment includes: dividing a semiconductor wafer into a plurality of semiconductor chips; and after the above step, forming a light-shielding film on each of the chip rear surface and chip side surface of each of the semiconductor chips.

A semiconductor device according to a typical embodiment includes a semiconductor chip mounted over a substrate arranged in a case having a light source, in which a light-shielding film is formed on each of the chip rear surface and chip side surface of the semiconductor chip.

A liquid crystal display according to a typical embodiment includes a semiconductor chip mounted over a substrate arranged in a case having a light source, in which a light-shielding film is formed on each of the chip rear surface and chip side surface of the semiconductor chip.

The following is a brief description of effects achievable by the embodiment of the representative aspect of the invention disclosed in the present application.

Thinning of a flat panel display can be promoted.

BRIEF DESCRIPTION OF THE DRAWINGS

FIG. 32 is a sectional view illustrating a step of manufacturing the semiconductor device according to Second Embodiment;

FIG. 33 is a sectional view illustrating a step of manufacturing the semiconductor device following the step in FIG. 32;

DETAILED DESCRIPTION

Figure 1:
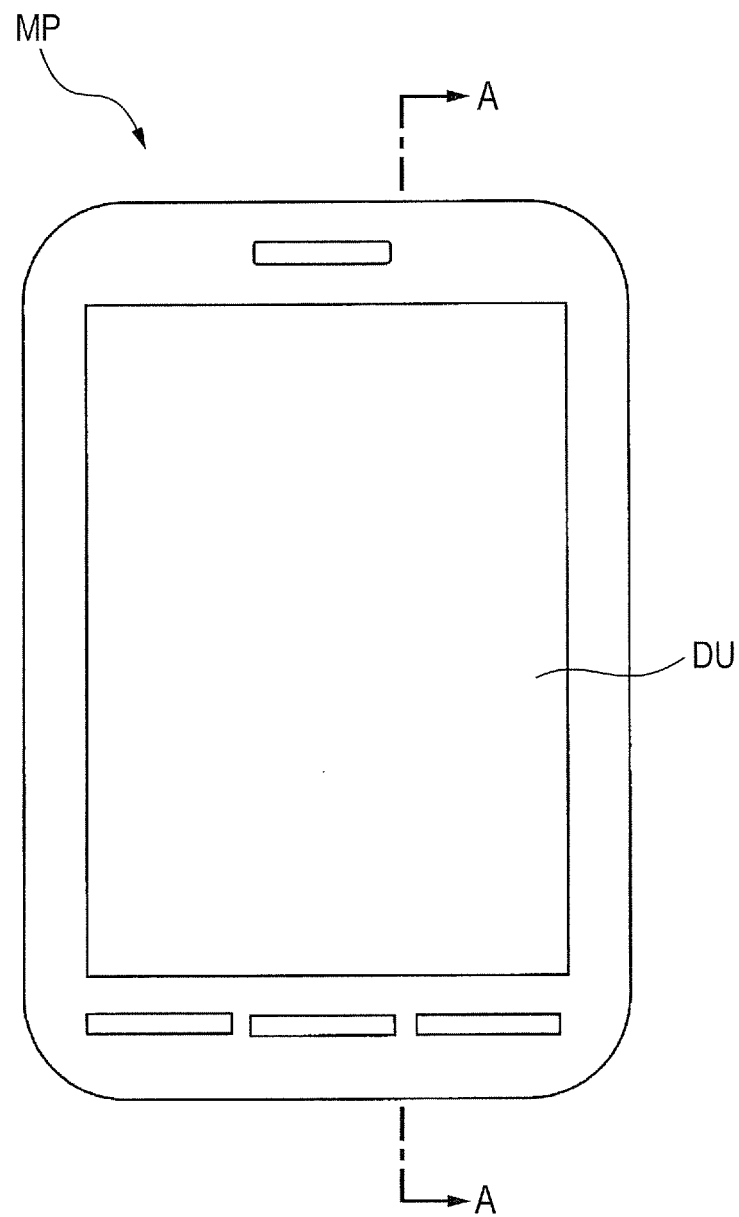
FIG. 1 is a view illustrating the external structure of a mobile phone.

One of the following embodiments will be described by dividing into a plurality of sections or embodiments, if necessary for convenience; however, unless otherwise indicated, they have a relationship in which one of them is a variation, detail, or supplementary explanation of part or the whole of the others, different from a state in which they have no relationship with each other.

In addition, when the number, etc., of elements (including the number of pieces, numerical value, quantity, and range, etc.) is referred to in the following embodiments, the number is not limited to the particular number, but may be larger than, smaller than, or equal to the particular number, unless otherwise indicated or clearly limited to the particular number in principle.

In addition, it is needless to say that, in the following embodiments, constituent elements (including element steps, etc.) are not necessarily essential, unless otherwise indicated or considered to be clearly essential in principle.

Similarly, when the shape or positional relationship of a constituent element, etc., is referred to in the following embodiments, shapes, etc., that are substantially approximate or similar to the shape, etc., are to be included, unless otherwise indicated or otherwise considered in principle. This is true with the aforementioned numerical value and range.

In addition, like components are denoted with like reference numerals in principle in each of the views for explaining embodiments, and duplicative explanations are omitted. For easy understanding of drawings, hatching lines are sometimes drawn even in a plan view.

(First Embodiment)
<Object to which the Invention is Applied>

Because a purpose of the present invention is to make the thickness of a flat panel display to be small, the technical ideas of the invention can be applied to electronic apparatuses provided with a liquid crystal display, plasma display, organic EL display, or the like, which are examples of the flat panel display. The flat panel displays are widely used, for example, as display devices in personal computers and word processors, etc., and further as display devices in TV sets and mobile phones. Accordingly, in First Embodiment, the technical ideas of the invention will be described, particularly taking, as an example, a mobile phone provided with a liquid crystal display, a typical example of the flat panel display. That is, in First Embodiment, the technical ideas of the invention will be described, taking, as an example, a mobile phone provided with a liquid crystal display; however, the technical ideas thereof are not limited thereto, but can be widely applied to electronic apparatuses provided with a flat panel display.

<Structure of Mobile Phone>

Figure 2:
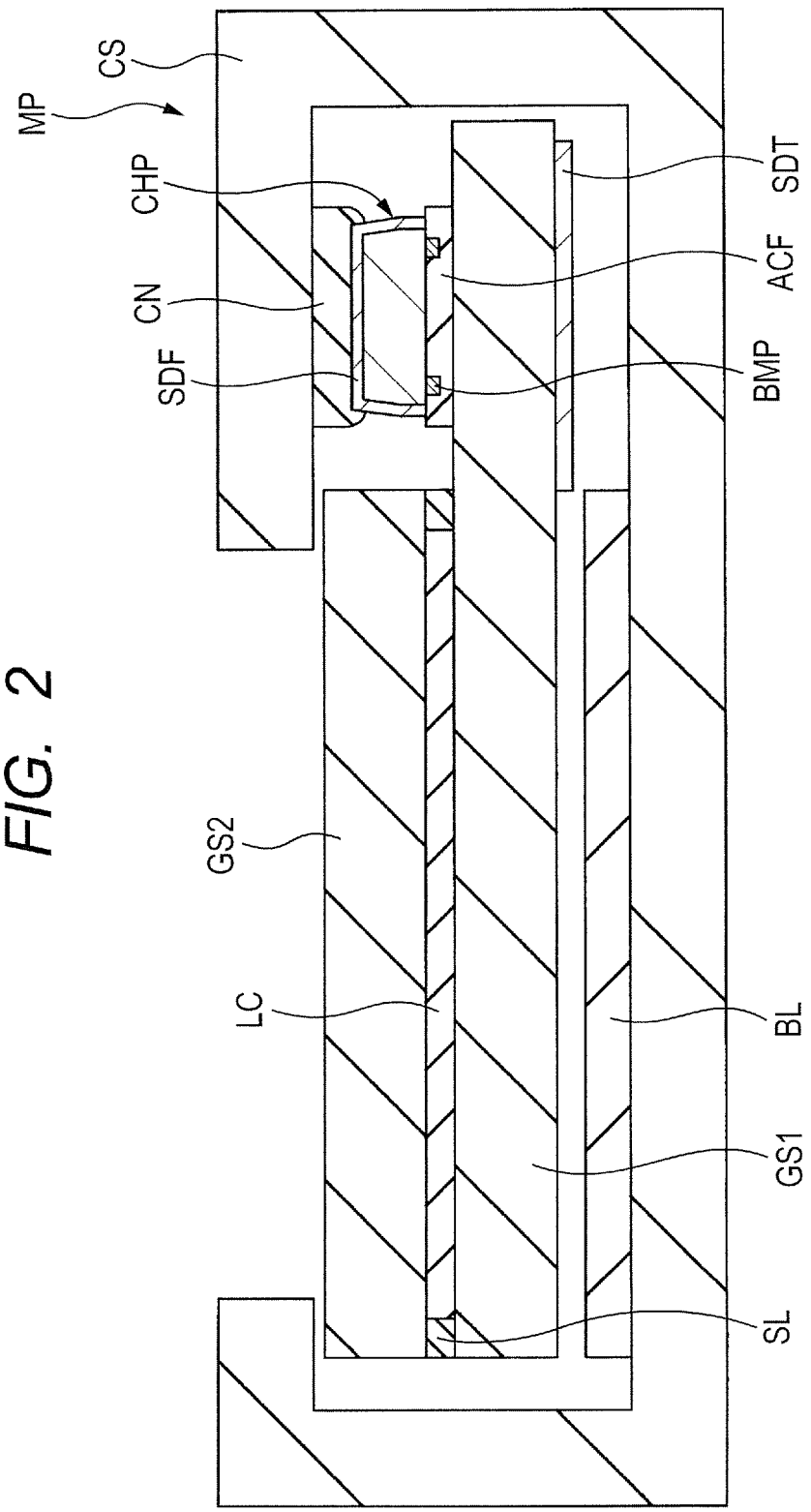
FIG. 2 is a sectional view, taken along A-A Line in FIG. 1.

FIG. 1 is a view illustrating the external structure of a mobile phone MP. As illustrated in FIG. 1, the mobile phone MP according to First Embodiment has a rectangular shape, and a display unit DU is arranged in the central area of the top surface. This display unit DU is formed, for example, of a liquid crystal display. Subsequently, the internal structure of the mobile phone MP thus formed will be described. FIG. 2 is a sectional view, taken along A-A Line in FIG. 1. As illustrated in FIG. 2, the mobile phone MP according to First Embodiment has a case CS, the upper surface of which an open region is present over, and a back light BL that serves as a light source is arranged at the bottom of the case CS. A glass substrate (substrate) GS 1 is arranged in the upper portion of the back light BL, and a glass substrate GS 2 is arranged in the upper portion of the glass substrate GS 1. Herein, a space is secured between the glass substrate GS 1 and the glass substrate GS 2 by arranging a sealant SL, and a liquid crystal member LC is sealed in the space. Thereby, the display unit of the mobile phone MP is formed. The size of the glass substrate GS 1 is larger than that of the glass substrate GS 2, so that a semiconductor chip CHP is mounted near to the display unit (in First Embodiment, over the glass substrate GS 1 and adjacent to the display unit). Specifically, a plurality of bump electrodes BMP are formed over the main surface of the semiconductor chip CHP, and the semiconductor chip CHP is mounted over the glass substrate GS 1 such that the main surface of the semiconductor chip CHP, over which the bump electrodes BMP are formed, faces the upper surface of the glass substrate GS 1. In this case, the bump electrodes BMP and wiring formed over the glass substrate GS 1 are electrically coupled to each other via an anisotropic conductive film ACF. Further, a light-shielding film SDF is formed on each of the side surface and rear surface of the semiconductor chip, and a cushion material CN is provided between the rear surface of the semiconductor chip CHP, on which the light-shielding film SDF is formed, and the case CS, in order to make it difficult that an impact applied from the outside of the mobile phone MP may be transmitted to the semiconductor chip CHP. On the other hand, a light-shielding material SDT is attached to the lower surface of the glass substrate GS 1, the lower surface being opposite to the upper surface thereof over which the semiconductor chip CHP is mounted, so that the material SDT is overlapped with the semiconductor chip CHP, when planarly viewed.

The mobile phone MP thus formed includes a liquid crystal display as stated above. That is, the liquid crystal display includes, as illustrated in FIG. 2: the glass substrate GS 1 having an upper surface and a lower surface, which are opposite to each other; the liquid crystal member LC arranged over the upper surface of the glass substrate GS 1; and the glass substrate GS 2 arranged so as to seal the liquid crystal member LC by a combination with the glass substrate GS 1. The liquid crystal display further includes: the back light (light source) BL arranged in the lower portion of the glass substrate GS 1; and the semiconductor chip CHP having, the chip top surface, the bump electrodes formed over the chip top surface, the chip rear surface opposite to the chip top surface, and the chip side surface located between the chip top surface and the chip rear surface. Herein, the semiconductor chip CHP is arranged over the upper surface of the glass substrate GS 1 such that the chip top surface (main surface, top surface) faces the upper surface of the glass substrate GS 1. An anisotropic conductive film that serves as a sealing member is formed between the chip top surface of the semiconductor chip CHP and the upper surface of the glass substrate GS 1, and the light-shielding film SDF is formed on both the chip rear surface of the semiconductor chip CHP, opposite to the chip top surface, and the chip side surface (side surface) of the chip CHP, located between the chip top surface and chip rear surface. Thus, the liquid crystal display unit and the semiconductor chip CHP are installed in the mobile phone according to First Embodiment. The liquid crystal display unit functions as a display unit displaying images and is formed by a plurality of liquid crystal display elements. The semiconductor chip CHP is formed to drive the liquid crystal display elements that form the liquid crystal display unit. An integrated circuit for controlling the liquid crystal display unit to display an image is formed in the semiconductor chip CHP. The semiconductor chip CHP has the function of controlling on/off of the liquid crystal display elements that form the liquid crystal display unit and is referred to as an LCD driver.

Of the constituent elements of the mobile phone MP, major elements with respect to the liquid crystal display are explained in FIG. 2; however, many other electric components are mounted in the mobile phone MP, thereby allowing the communication function and application function of the mobile phone MP to be achieved. Specifically, a plurality of both semiconductor chips (semiconductor devices), different from the LCD driver in which an CPU and a memory are formed, and passive elements, such as a resistance, capacitive element, and inductor, are mounted in the mobile phone MP, although not illustrated. The mobile phone MP is formed as follows: for example, the semiconductor chip CHP, which is the LCD driver, is controlled by an electronic circuit mounted in the mobile phone MP; the drive of the liquid crystal display unit is further controlled by the semiconductor chip CHP; and thereby an image is displayed on the liquid crystal display unit.

<Outline of Feature in First Embodiment>

The outline of a feature in First Embodiment will be described with reference to FIG. 2. In FIG. 2, the feature in First Embodiment is that the light-shielding film SDF is formed on each of the chip side surface and chip rear surface of the semiconductor chip CHP that forms the LCD driver. Thereby, it can be prevented according to First Embodiment that the light emitted from the back light BL may be emitted, from the chip side surface or the chip rear surface, onto the semiconductor chip CHP, for example, after the light is reflected in the case. In addition, the emission of the light, coming from the main surface (chip top surface) side of the semiconductor chip CHP, onto the semiconductor chip CHP can be prevented by the light-shielding material SDT attached to the lower surface of the glass substrate GS 1.

Herein, it can be considered that, for example, in order to prevent the emission of light onto the semiconductor chip CHP that forms the LCD driver, a light-shielding tape is attached so as to cover each of the chip side surface and chip rear surface of the semiconductor chip CHP. However, the thinning of electronic apparatuses, represented by the mobile phone MP, has been promoted in recent years, and with the thinning, there is a demand for thinning of a liquid crystal display to be mounted in the mobile phone MP. Due to the demand, for example, the glass substrate GS 1 and glass substrate GS 2, which are illustrated in FIG. 2, are also in the trend of being thinned, not only the thickness of the semiconductor chip CHP. As a result, it is considered that, depending on the thickness of each of the glass substrate GS 1, glass substrate GS 2, and semiconductor chip CHP, the shielding-tape covering the semiconductor chip CHP may protrude from the height of the surface of the glass substrate GS 2. Herein, one reason why the used light-shielding tape protrudes from the height of the surface of the glass substrate GS 2 is that the light-shielding tape has a light-shielding layer as well as a substrate layer and there is a limit for reducing the thickness of the light-shielding tape itself. As another reason, the light-shielding tape is a component (member) separate from the semiconductor chip CHP, and hence an adhesive is needed to attach it to the semiconductor chip CHP. Thereby, the mounting height of the semiconductor chip CHP becomes larger by the thickness of the adhesive. If the light-shielding tape covering the semiconductor chip CHP protrudes from the height of the surface of the glass substrate GS 2, as stated above, the thinning of the mobile phone MP is hampered, and an impact from the outside of the mobile phone MP is likely to be transmitted to the semiconductor chip CHP via the protruded light-shielding tape, thereby increasing the fear that a crack may be caused in the semiconductor chip CHP. If a light-shielding tape is used as a component separate from the semiconductor chip CHP, as stated above, there is the fear that, due to the protrusion of the light-shielding tape, the thinning of the mobile phone MP may be hampered and a reduction in the reliability of the mobile phone MP itself may be caused. In addition, as a demerit occurring when a light-shielding tape, a component separate from the semiconductor chip CHP that forms the LCD driver, is used, there is the problem that material cost (production cost) is increased, because a step of attaching the light-shielding tape to cover the semiconductor chip CHP is separately needed or the light-shielding tape as a separate component is needed. In addition, mobile phones MP in which a touch panel is installed have been on the market in recent years. The touch panel is attached to the upper surface of the glass substrate GS 2 illustrated in FIG. 2. Accordingly, if a light-shielding tape as a separate component protrudes from the surface of the glass substrate GS 2, there is the problem that the protrusion becomes an obstacle when the touch panel is arranged over the glass substrate GS 2.

On the other hand, in First Embodiment, a light-shielding tape, which is a component separate from the semiconductor chip CHP that forms the LCD driver, is not used for shielding the light incident from the chip side surface or the chip rear surface of the chip CHP, and the light-shielding film SDF is formed on each of the chip side surface and chip rear surface of the chip CHP itself. In other words, a light-shielding layer is only formed directly (without the use of an adhesive) on each of the chip side surface and chip rear surface of the semiconductor chip CHP itself, in First Embodiment. Thereby, a light-shielding tape as a separate component is not used according to First Embodiment, and hence the mounting height of the semiconductor chip CHP can be made smaller than or equal to the thickness of the glass substrate GS 2. As a result, the thinning of the liquid crystal display, and the subsequent thinning of the mobile phone MP in which the liquid crystal display is mounted can be promoted. That is, according to First Embodiment, the light-shielding film SDF is formed on each of the chip side surface and chip rear surface of the semiconductor chip CHP itself, and hence the thinning of the mobile phone MP can be more promoted than in the case where a light-shielding tape as a separate component is used, while the light incident from the chip side surface or chip rear surface of the semiconductor chip CHP is being suppressed. Further, because the protrusion of the light-shielding tape from the glass substrate GS 2 is suppressed, an impact from the outside of the mobile phone MP is hardly transmitted to the semiconductor chip CHP. As a result, a crack that may be caused in the semiconductor chip CHP can be suppressed, and hence the reliability of the mobile phone MP can be improved. Further, because a light-shielding tape as a separate component is not used, the cost for the light-shielding tape can be reduced. Furthermore, because it is not needed to separately provide the step of attaching the light-shielding tape and the protrusion of the light-shielding tape from the glass substrate GS 2 is prevented, an obstacle occurring when the touch panel is arranged over the glass substrate GS 2 can be solved. That is, as illustrated in FIG. 2, the mobile phone MP having a structure in which the touch panel is not arranged over the glass substrate GS 2 is described in First Embodiment; however, the obstacle occurring when the touch panel is arranged over the glass substrate GS 2 can be solved by applying the technical ideas according to First Embodiment. Accordingly, it is also effective to apply the technical ideas according to First Embodiment particularly to the mobile phone MP having the touch panel over the glass substrate GS 2.

<Necessity for Shielding Semiconductor Chip from Light>

In First Embodiment, the light-shielding film SDF is formed on each of the chip side surface and chip rear surface of the semiconductor chip CHP that forms the LCD driver, as stated above. Herein, the reason why it is needed to suppress the incidence of light into the semiconductor chip CHP in the first place will be described. Before the description, the outline of a circuit block in the semiconductor chip CHP that forms the LCD driver will be described.

Figure 3:
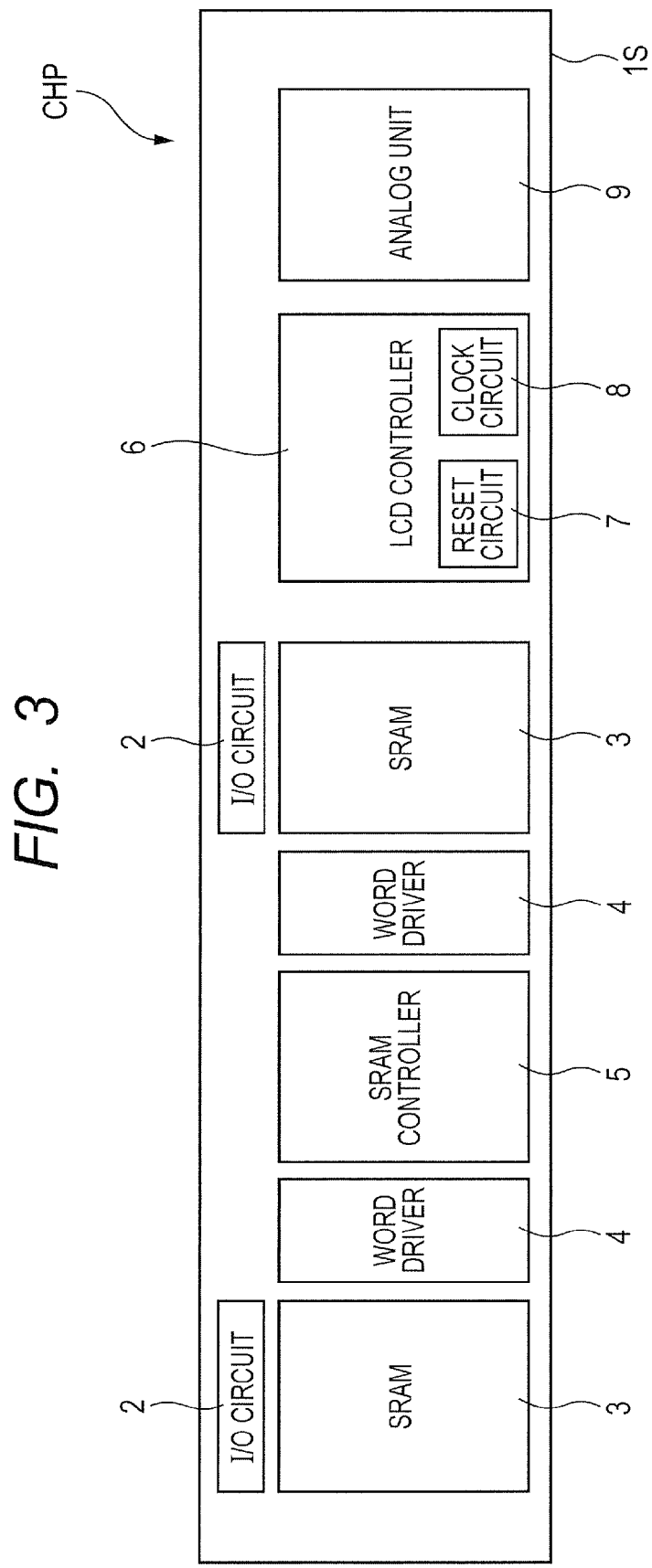
FIG. 3 is a functional block view illustrating a function of an LCD driver.

FIG. 3 is a functional block view illustrating a function of the LCD driver. In FIG. 3, the semiconductor chip CHP according to First Embodiment has I/O circuits 2, SRAMs (Static Random Access Memory) 3, word drivers 4, an SRAM controller 5, an LCD controller 6, and an analog unit 9.

The I/O circuit 2 has the function of exchanging the data to be inputted/outputted to/from the semiconductor chip CHP; and the SRAM 3 is an example of a memory circuit that memorizes data. The SRAM 3 has a structure in which memory elements for memorizing data are arranged in an array pattern and memorizes image data, etc., to be displayed on the liquid crystal display. The word driver 4 has the function of selecting lines in the SRAM 3 that are arranged in an array pattern. The SRAM controller 5 has the function of controlling write/read of data into/from the SRAM 3. That is, the SRAM controller 5 is formed by an address decoder and a read/write control circuit, which are used for controlling read/write from/into the SRAM 3.

The LCD controller 6 has the function of generating both an access signal with a microcomputer mounted outside the LCD driver (semiconductor chip CHP) and a timing signal for operating an internal circuit necessary for the display of the SRAM 3 and a counter, etc. The LCD controller 6 includes a reset circuit 7 for resetting a display and a clock circuit 8 for generating a clock signal, etc. The analog unit 9 has the function of increasing the voltage level of image data stored in the SRAM 3 to convert it into a voltage suitable for a liquid crystal display cell (level shift function), etc. That is, the analog circuit 9 is formed to include a booster circuit for increasing a voltage, etc., so that various voltages to be applied to the liquid crystal cell are generated.

The major functions of the LCD driver are achieved by the aforementioned functional blocks and these functional blocks are arranged so as to line up in the longitudinal direction of the semiconductor chip CHP having a rectangular shape, as illustrated in FIG. 3 for example. Each of the functional blocks that form the LCD driver is formed by a MISFET (Metal Insulator Semiconductor Field Effect Transistor) formed over the semiconductor substrate 1S and multilayer wiring formed over the MISFET. In this case, for example, each of the SRAM controller 5 and the LCD controller 6 is formed by a digital circuit, and the analog unit is formed by an analog circuit. Although each of the SRAM controller 5 and the LCD controller 6 is formed by the digital circuit, the MISFET that forms the digital circuit is formed by a low-voltage MISFET, the absolute value of the operating voltage of which is small. That is, each of the SRAM controller 5 and the LCD controller 6 is formed by a logic circuit, thereby allowing an integration degree to be increased. Therefore, the MISFET are being miniaturized more and more, and with the miniaturization thereof, the absolute value of the operating voltage of the MISFET becomes low. Accordingly, of LCD drivers, a low-voltage MISFET, the absolute value of the operating voltage of which is smallest, is used in the SRAM controller 5 and the LCD controller 6. The absolute value of the operating voltage of the MISFET, for example, used in the LCD controller 6 is approximately 1.5 V.

On the other hand, the analog unit 9 is formed by an analog circuit. Of LCD drivers, the MISFET that forms the analog circuit is formed by a high-voltage MISFET, the absolute value of the operating voltage of which is relatively large. It is because the analog circuit has the function of converting the voltage level of image data to apply middle-high voltage (several tens voltage) to the liquid crystal display cell. Thus, a plurality of types of MISFETs, the absolute value of the operating voltage of each of which is different from the others, are formed in the semiconductor chip CHP that forms the LCD driver. In particular, the low-voltage MISFET, the absolute value of the operating voltage of which is smallest, is used in the SRAM controller 5 and the LCD controller 6. On the other hand, the high-voltage MISFET, the absolute value of the operating voltage of which is relatively large, is used in the analog unit 9.

Subsequently, easy operations of the LCD driver will be described. Serial data for displaying an image are first inputted from a microcomputer mounted outside the LCD driver (semiconductor chip CHP), etc. The serial data are inputted to the LCD controller 6 via the I/O circuit 2. The LCD controller 6 to which the serial data have been inputted converts the serial data into parallel data based on a clock signal generated by the clock circuit 8. The LCD controller 6 outputs a control signal to the SRAM controller 5 in order to store the converted parallel data into the SRAM 3. Upon receiving the control signal from the LCD controller 6, the SRAM controller 5 operates the word driver 4 to make the SRAM 3 store image data that are the parallel data. The SRAM controller 5 reads out the image data stored in the SRAM 3 at a predetermined timing to output them to the analog circuit 9. The analog circuit 9 converts the voltage level of the image data (parallel data) to output them from the LCD driver. The image data (parallel data) outputted from the LCD driver are applied to the individual liquid crystal display cells such that an image is displayed. Thus, an image can be displayed on the liquid crystal display by the LCD driver.

As stated above, a booster circuit for increasing a voltage level is formed in the analog circuit 9, and image data (voltage data) whose voltage levels have been increased by the booster circuit are applied to the respective liquid crystal display cells. At the time, the orientation direction of the liquid crystal included in each liquid crystal display cell is changed by the image data (voltage data), and hence the optical transparency of each liquid crystal display cell is changed and an image is displayed. At the time, it is preferable that the voltage of the image data (voltage data), which has been increased by the booster circuit, is the same as a designed value. If the voltage level of the image data (voltage data) is decreased, a change in the orientation direction of liquid crystal becomes blunt. As a result, the on/off characteristic (sharpness of contrast) of each liquid crystal display cell becomes dull, thereby decreasing the contrast of an displayed image. Accordingly, it is needed to avoid a decrease in the voltage level of the image data (voltage data) outputted from the booster circuit, from the viewpoint of suppressing a decrease in the contrast of an image.

Herein, if light is incident into the semiconductor chip CHP, an output voltage outputted from the booster circuit formed in the semiconductor chip CHP is decreased. Hereinafter, this mechanism will be described. For example, the semiconductor chip CHP the forms the LCD driver is formed of silicon (Si) that is a semiconductor material. Accordingly, if the light having an energy larger than or equal to the bandgap of silicon, an electron located in the valence band of silicon absorbs the light energy larger than or equal to the bandgap, thereby the electron located in the valence band is excited to the conduction band. Because the electron excited to the conduction band can move freely, a leak current flows by the electron excited to the conduction band. Because silicon particularly absorbs the light having a wavelength of approximately 0.6 µm to 1.1 µm, a leak current flowing in the semiconductor chip CHP is increased when the light having a wavelength within the aforementioned wavelength range is emitted onto the semiconductor chip CHP. The back light BL is mounted in the mobile phone MP, as illustrated in FIG. 2, and the light emitted from the back light BL includes the light having a wavelength within the aforementioned wavelength range, and hence a leak current generated in the semiconductor chip CHP is increased when the light emitted from the back light BL is incident into the chip CHP. A booster circuit is formed in the semiconductor chip CHP. When a leak current flowing into the booster circuit is increased, a load for the booster circuit is increased. Because the booster circuit has the characteristic that an output voltage becomes small as a load is increased, an increase in the leak current generated in the semiconductor chip CHP means, as a result, that a decrease in the output voltage from the booster circuit is induced. From what has been stated above, it can be known that: if the light having an energy larger than or equal to a bandgap is incident into the semiconductor chip CHP, a leak current is increased by an electron being excited from a valence band to a conduction band; and with the increase in the leak current, a load for the booster circuit is increased, thereby causing a decrease in the output voltage from the booster circuit. If the output voltage from the booster circuit is decreased by such a mechanism, the voltage applied to the liquid crystal display cell becomes small, and accordingly the orientation direction of the liquid crystal becomes blunt, thereby causing the contrast of a displayed image to be decreased. Accordingly, if light is incident into the semiconductor chip CHP that forms the LCD driver, not only an increase in power consumption with an increase in a leak current, but also a decrease in the contrast of a displayed image are induced. Accordingly, there is a need for shielding the semiconductor chip CHP from light, from the viewpoint of suppressing both a decrease in power consumption and a decrease in the contrast of a displayed image.

<Details of Features in First Embodiment>

Therefore, it is needed to shield the semiconductor chip CHP from light. In First Embodiment, the structure for shielding the semiconductor chip CHP from light has been innovated. It is because, as stated above, if the semiconductor chip CHP is shielded from light by using a light-shielding tape that is a component separate from the chip CHP, it becomes difficult to sufficiently achieve the thinning of a mobile phone, reduction in the production cost of a mobile phone, and improvement of the reliability of a mobile phone. That is, in First Embodiment, on the premise that the semiconductor chip CHP is shielded from light, a means for shielding the chip from light has been innovated, from the viewpoint of achieving the thinning a mobile phone, reduction in the production cost of a mobile phone, and improvement of the reliability of a mobile phone. Hereinafter, the technical ideas according to First Embodiment in which this innovation has been made will be described in detail.

Figure 4:
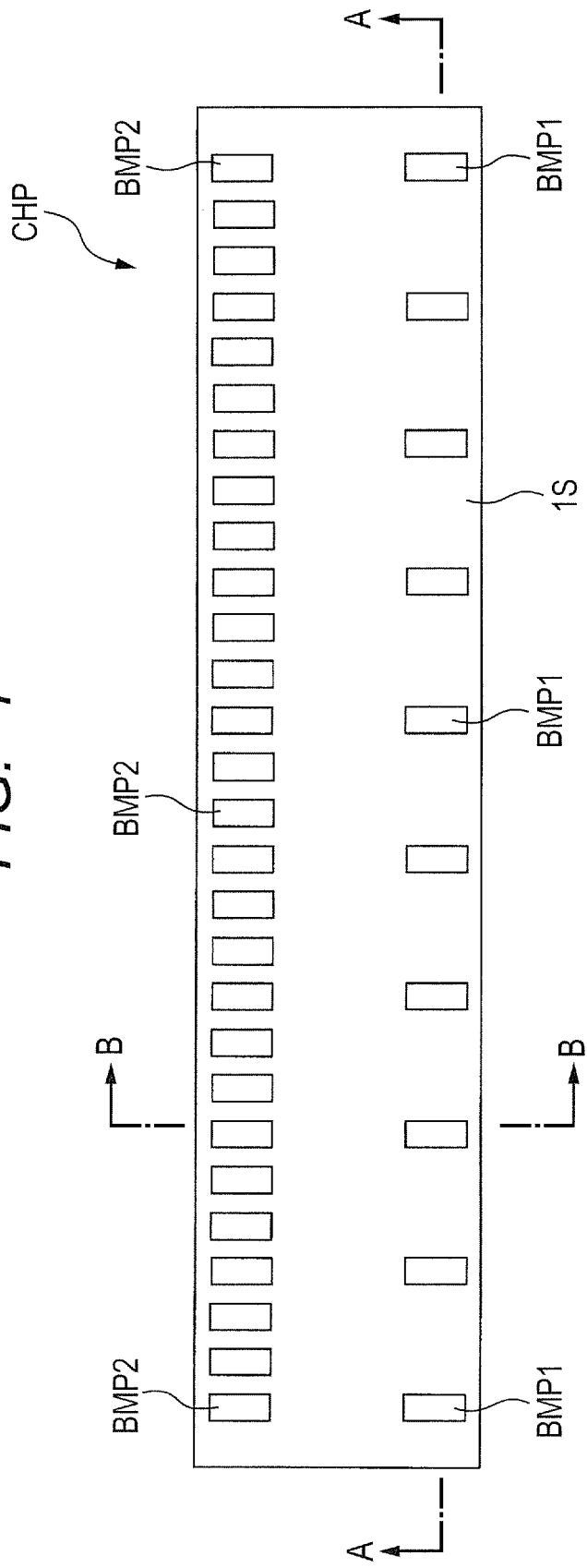
FIG. 4 is a plan view illustrating the top surface of a semiconductor chip that forms the LCD driver.

The external structure of the semiconductor chip CHP that forms the LCD driver will be first described. FIG. 4 is a plan view illustrating the top surface of the semiconductor chip CHP that forms the LCD driver. In FIG. 4, the semiconductor chip CHP has the semiconductor substrate 1S that is formed, for example, into an elongated rectangle, and the LCD driver for driving, for example, a liquid crystal display is formed over the main surface of the chip.

The semiconductor chip CHP has a rectangular shape having a pair of shorter sides and a pair of longer sides. Bump electrodes BMP 1 are arranged along one of the pair of the longer sides (lower side in FIG. 4). These bump electrodes BMP 1 are arranged in a straight line. Each of the bump electrodes BMP 1 functions as an external coupling terminal to be coupled to an LSI (large Scale Integration) made of an semiconductor element and wiring that are formed in the semiconductor chip CHP. In particular, the bump electrodes BP 1 are ones for digital input signals or analog input signals.

Subsequently, bump electrodes BMP 2 are arranged along the other of the pair of the longer sides (upper side in FIG. 4). These bump electrodes BMP 2 are also arranged in a straight line at a density higher than, for example, that of the bump electrodes BMP 1. Alternatively, the bump electrodes BMP 2 may be arranged in two straight lines along the longer side, and the bump electrodes BMP 2 on each of the two straight lines may be arranged in a staggered pattern to each other. Thereby, the bump electrodes BMP 2 can be arranged at a high density. Each of these bump electrodes BMP 2 also functions as an external coupling terminal for coupling an LSI formed in the semiconductor substrate 1S to the outside. In particular, the bump electrodes BMP 2 are ones for the output signals from the LSI.

Thus, the bump electrodes BMP 1 and the bump electrodes BMP are formed along the pair of the longer sides that forms the outer circumference of the semiconductor chip CHP. In this case, because the number of the bump electrode BMP 2 is larger than that of the bump electrodes BMP 1, the bump electrodes BMP 2 are arranged, along the longer side, at a density higher than that of the bump electrodes BMP 1 or in a staggered pattern, while the bump electrodes BMP 1 are arranged in a straight line along the longer side. This is because the bump electrodes BMP 2 are ones for the output signals outputted from the LCD driver, while the bump electrodes BMP 1 are ones for the input signals to be inputted to the LCD driver. That is, the input signals to be inputted to the LCD driver are serial data, and hence the number of the bump electrodes BMP 1, which are external coupling terminals, is not so large. On the other hand, the output signals outputted from the LCD driver are parallel data, and hence the number of the bump electrodes BMP 2, which are external coupling terminals, becomes large. That is, because the bump electrodes BMP 2 for output signals are provided so as to correspond to the liquid crystal display elements, a considerable number of the bump electrodes BMP 2 are needed. Accordingly, the number of the bump electrodes BMP 2 for output signals becomes larger than that of the bump electrodes BMP 1 for input signals. Therefore, it is needed to arrange the bump electrodes BMP 2 for output signals at a density higher than that of the bump electrodes BMP 1 for input signals, and the number of the bump electrodes BMP 2 is sometimes increased by arranging them in a staggered pattern, while the bump electrodes BMP 1 for input signals can be arranged in a straight line along the longer side.

Although the bump electrodes BMP 1 and bump electrodes BMP 2 are arranged along the pair of the longer sides that form the semiconductor chip CHP in FIG. 4, the bump electrodes can be further arranged along the pair of shorter sides, in addition to the pair of the longer sides.

Figure 5:
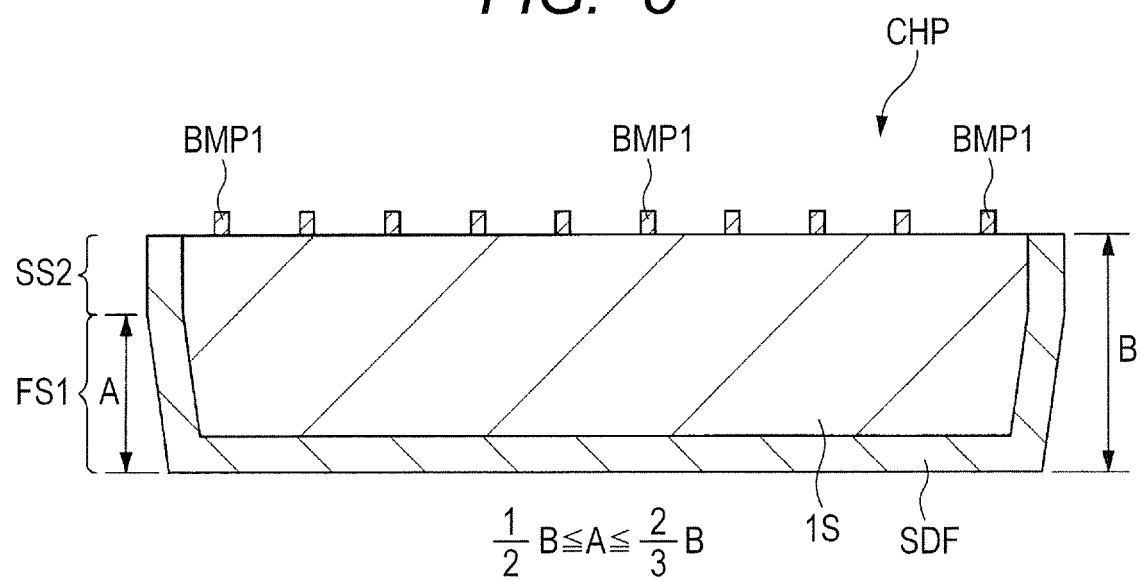
FIG. 5 is a sectional view, taken along A-A Line in FIG. 4.
Figure 6:
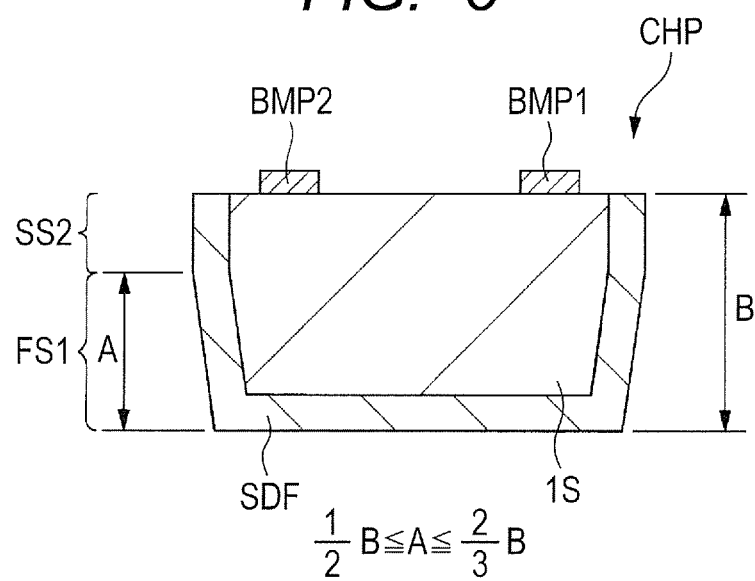
FIG. 6 is a sectional view, taken along B-B Line in FIG. 4.

Subsequently, FIG. 5 is a sectional view, taken along A-A Line in FIG. 4. As illustrated in FIG. 5, the light-shielding film SDF is formed on each of the chip side surface and chip rear surface of the semiconductor substrate 1S. The bump electrodes BMP 1 are arranged at predetermined intervals over the chip top surface of the semiconductor substrate 1S. The bump electrode BMP 1 is formed, for example, of a gold film. FIG. 6 is a sectional view, taken along B-B Line in FIG. 4. As illustrated in FIG. 6, it is known that, also in this sectional direction, the light-shielding film SDF is formed on each of the chip side surface and chip rear surface of the semiconductor substrate 1S. The bump electrodes BMP and bump electrodes BMP 2 are arranged over the chip top surface of the semiconductor substrate 1S.

Herein, a first feature in First Embodiment is that the light-shielding film SDF is formed on each of the chip side surface and chip rear surface of the semiconductor chip CHP that forms the LCD driver. That is, a feature in First Embodiment is that the light-shielding film SDF is formed to be integrated with the semiconductor chip CHP itself. Accordingly, it is not needed to use a light-shielding tape that is a component separate from the semiconductor chip CHP, thereby allowing a problem, occurring when a light-shielding tape that is a separate component is used, to be avoided. The light-shielding film SDF is required to meet the conditions as follows. That is, as a first function, the light-shielding film is required to have the property of shielding light. Specifically, the light-shielding film SDF is required to have the function of shielding the light having an energy larger than or equal to the bandgap of silicon. As a second function, the light-shielding film SDF is required to have the function in which a material that forms the light-shielding film SDF is not easily diffused into silicon, because the film SDF is formed to be directly in contact with the semiconductor chip CHP itself made of silicon (Si). It is because, for example, if the light-shielding film SDF is formed of a conductive material and the diffusion coefficient of the film into silicone is high, a possibility is increased, in which the conductive material diffused into silicon may be diffused to the semiconductor element (MISFET) formed in the semiconductor chip CHP, and thereby a problem, such as a decrease in insulation resistance, increase in leak current, or the like, may be caused.

The light-shielding film SDF according to First Embodiment may be an insulating film or a conductive film, as far as the film has the aforementioned first function and second function. Specifically, a titanium (Ti) film, titanium oxide film, titanium-based material films represented by a titanium nitride film, and nickel (Ni)-based material films represented by a nickel film, each of which is formed by a sputtering process; and a tungsten film formed by a CVD process can be used as the light-shielding film SDF. Although varied depending on a material, the thickness of the light-shielding film SDF is preferably, for example, within a range of approximately 50 nm to 500 nm. The minimum of the thickness of the film is determined from the viewpoint of securing a light shielding property. On the other hand, the maximum thereof is determined from the viewpoint of suppressing a warp in the semiconductor chip CHP. For example, if the thickness of the light-shielding film SDF is made too large, a warp is caused in the chip CHP, due to the difference between the linear expansion coefficient of silicon, a major material of the chip CHP, and that of the light-shielding film SDF. If a warp is caused in the semiconductor chip CHP, a strain is caused on the chip top surface of the chip CHP, thereby causing the coupling reliability between the respective bump electrodes BMP 1 and bump electrodes BMP 2, which are formed over the chip top surface, and the wiring formed over the glass substrate to be decreased. Accordingly, it is needed to prevent a warp in the semiconductor chip CHP, and the maximum of the thickness of the light-shielding film SDF is determined from the viewpoint of achieving this purpose. Alternatively, the light-shielding film SDF may also be formed by a multilayer film, not only by a single layer film.

Subsequently, a second feature in First Embodiment is that the chip side surface of the semiconductor chip CHP has an inclined surface inclined with respect to the chip rear surface of the chip CHP. Thereby, the light-shielding film SDF can be easily formed on the chip side surface thereof. That is, if the chip side surface is perpendicular to the chip rear surface, it becomes difficult to form the light-shielding film SDF on the chip rear surface; however, by inclining the chip side surface with respect to the chip rear surface, as illustrated in FIGS. 5 and 6, it also becomes easy to form the light-shielding film on the chip side surface. In this case, because the chip side surface is formed to have an inclined surface, the width of the chip rear surface is smaller than that of the chip top surface.

Figure 7:
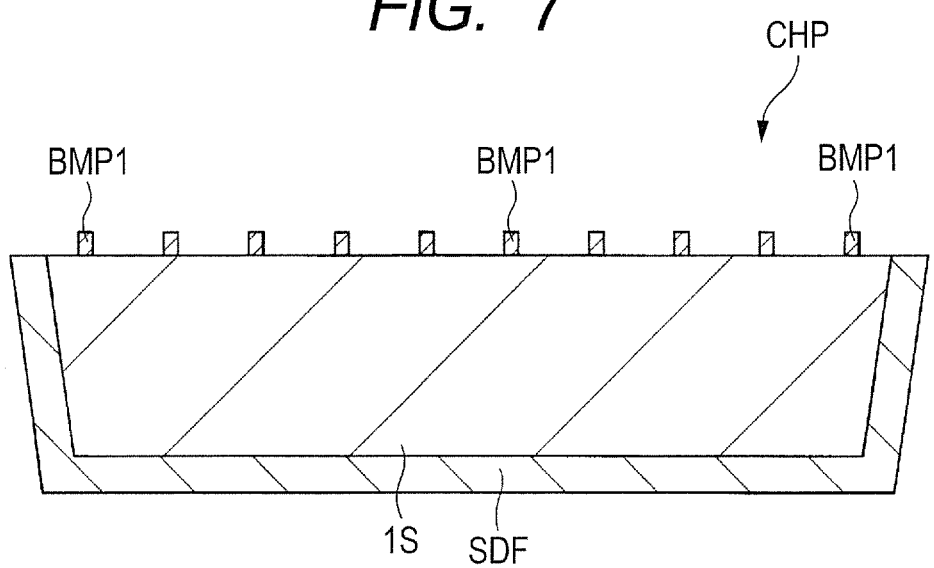
FIG. 7 is a sectional view illustrating a structure in which the whole chip side surface is inclined.
Figure 8:
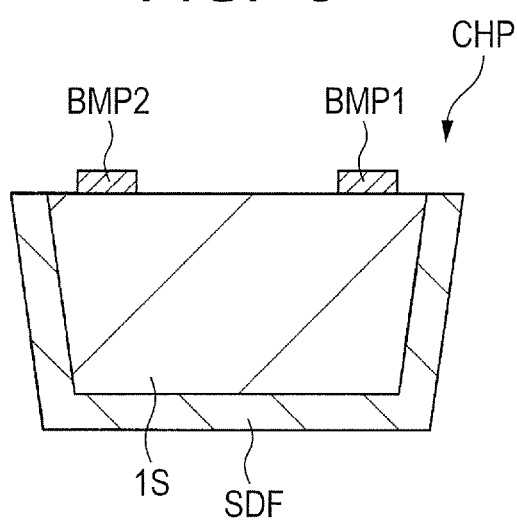
FIG. 8 is a sectional view illustrating a structure in which the whole chip side surface is inclined.

In First Embodiment, the whole chip side surface is not inclined, but the chip side surface is formed by both a first side surface area FS 1 formed nearer to the chip rear surface than to the chip top surface and a second side surface area SS 2 formed nearer to the chip top surface than to the chip rear surface, and the inclined surface is formed on the first side surface area FS 1. The reason why the chip side surface is formed in such a way will be described. For example, each of FIGS. 7 and 8 illustrates a sectional view when the whole chip side surface is inclined. In this case, the corner portion at which the chip side surface and chip top surface intersect with each other has an acute angle shape. If a corner portion having such an acute angle shape is present, chipping (crack and chip) is likely to be caused. A semiconductor chip CHP in which such chipping is caused becomes a defective.

Accordingly, in the chip side surface of the semiconductor chip CHP according to First Embodiment, the first side surface area FS 1 having an inclined surface and the second side surface area SS 2 not inclined are formed, as illustrated in FIGS. 5 and 6, not making the whole chip side surface to be inclined. In this case, by forming the first side surface area FS 1 nearer to the chip rear surface than to the chip top surface and by forming the second side surface area SS 2 nearer to the chip top surface than to the chip rear surface, the corner portion at which the chip side surface and the chip top surface intersect with each other has a perpendicular shape, not an acute angle shape. Therefore, according to First Embodiment, the light-shielding film SDF can be easily formed on the chip side surface, while chipping is being prevented from occurring in the semiconductor chip CHP. It is preferable that the thickness of the first side surface area FS 1 having an inclined surface is made as large as possible, particularly from the viewpoint of sufficiently forming the light-shielding film SDF on the chip rear surface. Specifically, it is preferable that, when it is assumed that the thickness of the first side surface area FS 1 is A and the thickness of the semiconductor chip CHP is B, the first side surface area FS 1 is formed such that B/2≤A≤2B/3 is satisfied, as illustrated in FIGS. 5 and 6. In this case, the light-shielding film SDF can be sufficiently formed on the chip side surface, while chipping is being prevented from occurring in the semiconductor chip CHP.

Figure 9:
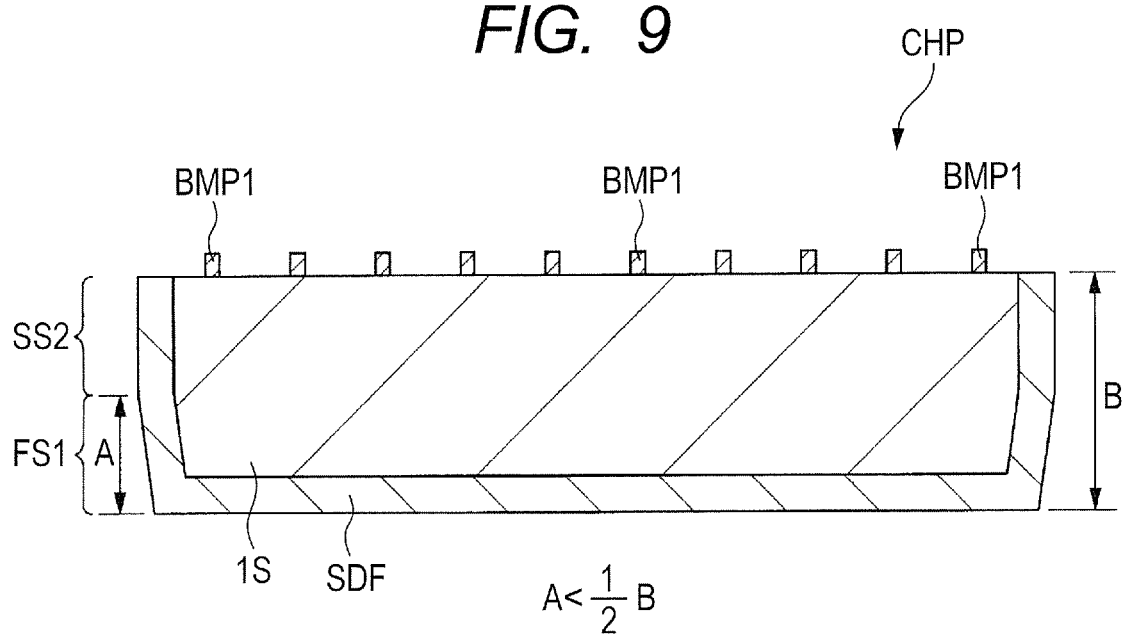
FIG. 9 is a sectional view illustrating a variation of the structure in which the whole chip side surface is inclined.
Figure 10:
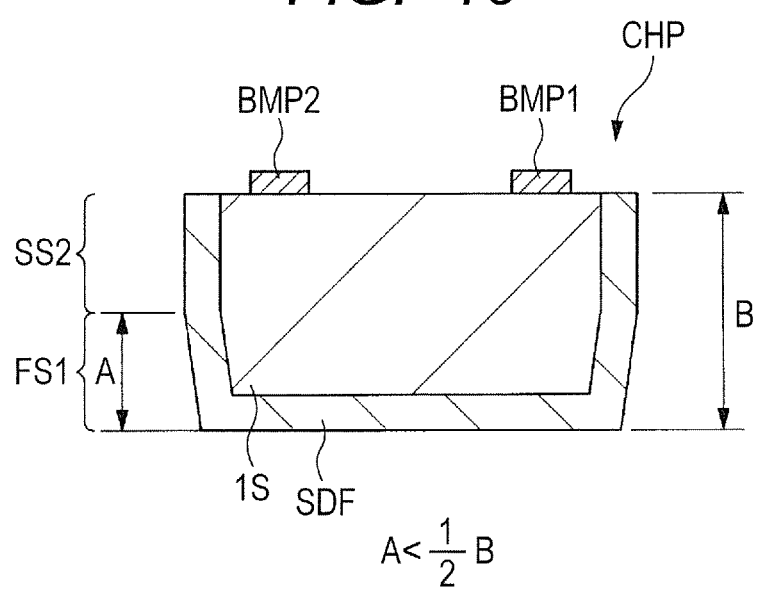
FIG. 10 is a sectional view illustrating a variation of the structure in which the whole chip side surface is inclined.

However, the technical ideas according to First Embodiment are not limited thereto. For example, when it is assumed that the thickness of the first side surface area FS 1 is A and the thickness of the semiconductor chip CHP is B, the first side surface area FS 1 may be formed such that A<B/2 is satisfied, as illustrated in FIGS. 9 and 10. Also, in this case, the light-shielding film SDF can be sufficiently formed on the chip side surface, while chipping is being prevented from occurring in the semiconductor chip CHP. Further, the case where the light-shielding film SDF can be sufficiently formed on the chip side surface even when an inclined surface is not formed on the chip side surface, can also be considered. Specifically, when the space between the semiconductor chips CHPs is sufficiently large and the thickness of the chip CHP is sufficiently small, it is considered that the light-shielding film SDF having a sufficient thickness can be formed on the chip side surface even when an inclined surface is not formed on the chip side surface. Herein, if the space between the semiconductor chips CHPs is made too large, there is the fear that the semiconductor chip CHP fixed to a back grinding tape may be peeled off from the tape. Accordingly, the space thereof is preferably, for example, within a range of 70 to 100 μm. However, when the viewpoint of easily forming the light-shielding film SDF on the chip side surface of the semiconductor chip CHP is taken into consideration, it is, after all, preferable to form the first side surface area FS 1 such that B/2≤A≤2B/3 is satisfied, as illustrated in FIGS. 5 and 6.

Figure 11:
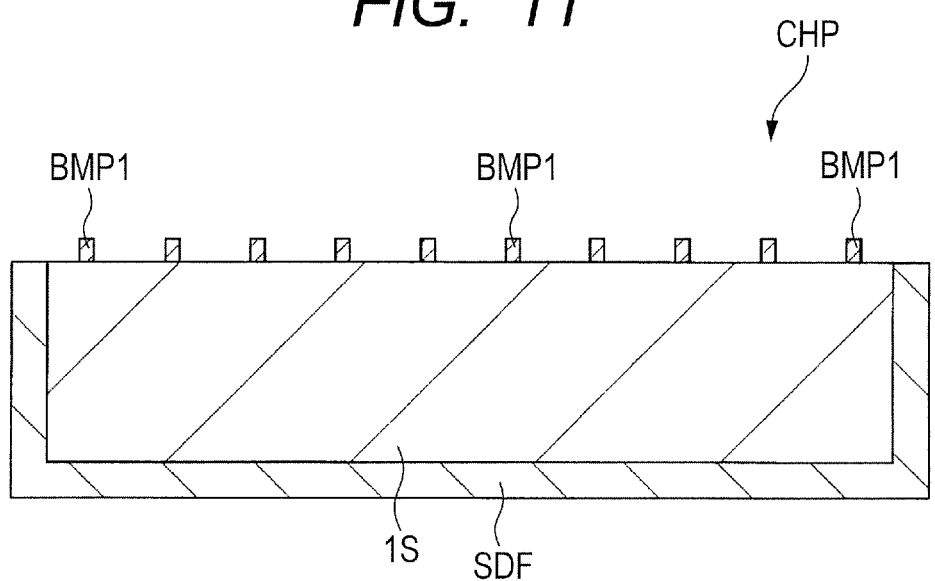
FIG. 11 is a sectional view illustrating a structure in which the chip side surface is not inclined.
Figure 12:
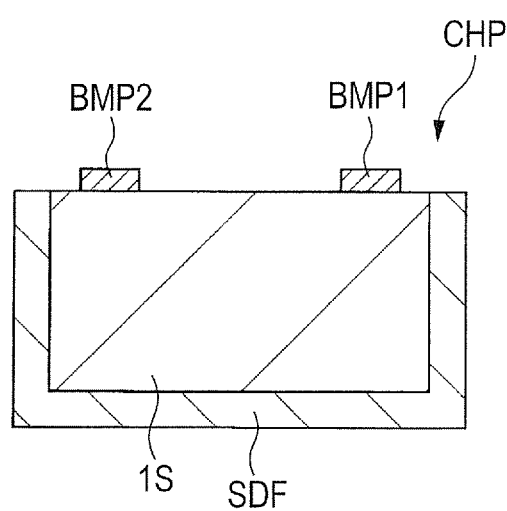
FIG. 12 is a sectional view illustrating a structure in which the chip side surface is not inclined.

From what has been described above, the essence of the technical ideas according to First Embodiment is that the light-shielding film SDF is formed on each of the chip side surface and chip rear surface so as to be integrated with the semiconductor chip CHP itself (first feature). Because the chip rear surface and chip side surface of the semiconductor chip CHP are shielded from light according to the first feature, it is not needed to provide a light-shielding tape that is a separate component, thereby allowing the thinning of a flat panel display, a purpose of First Embodiment, to be achieved. Further, it is particularly preferable to form the chip side surface to have an inclined surface inclined with respect to the chip rear surface (second feature), thereby allowing the light shielding property on the chip side surface to be easily secured. As specific aspects of structures in each of which an inclined surface is formed on the chip side surface, the most preferred aspect is illustrated in FIGS. 5 and 6, and the second-most preferred aspect is illustrated in FIGS. 9 and 10. However, the second feature is not an essential structure for achieving the purpose of First Embodiment, but a preferred structure, and hence it is considered that the light shielding property on the chip side surface can be sufficiently secured even when the chip side surface is not inclined with respect to the chip rear surface (see FIGS. 11 and 12), depending on the conditions under which the light-shielding film SDF is formed, represented by the space between the semiconductor chips CHPs and the thickness of the semiconductor chip CHP.

<Method of Manufacturing Semiconductor Device According to First Embodiment>

Figure 13:
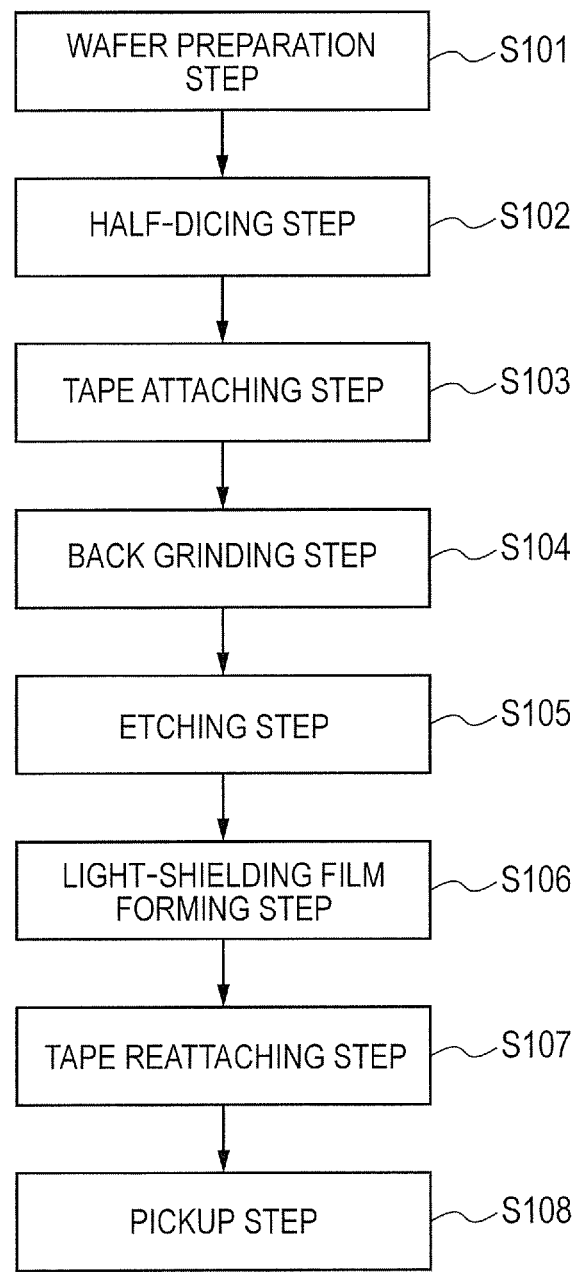
FIG. 13 is a flowchart explaining the flow of a method of manufacturing a semiconductor device according to First Embodiment of the present invention.
Figure 14:
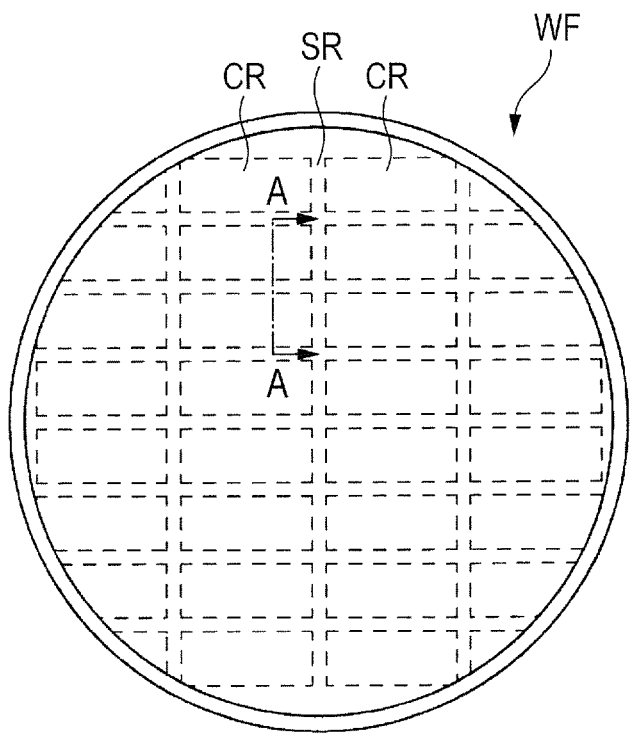
FIG. 14 is a plan view of a provided semiconductor wafer.
Figure 15:
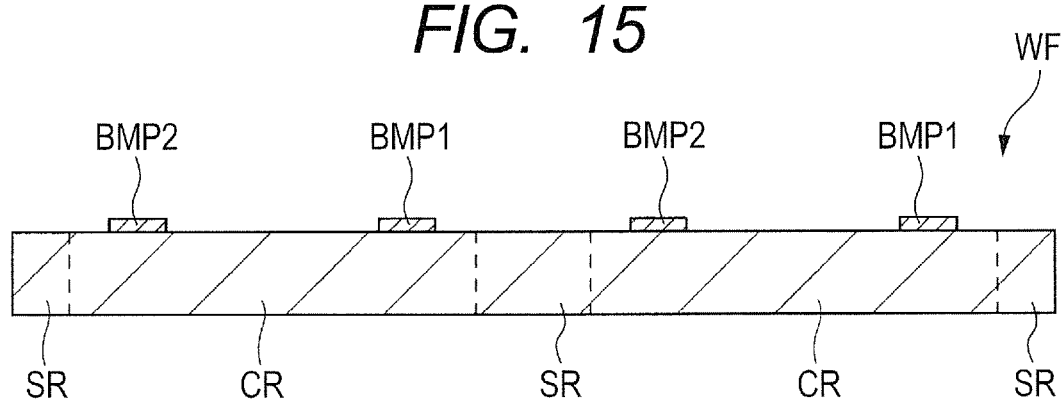
FIG. 15 is a sectional view, taken along A-A Line in FIG. 14.

The semiconductor device according to First Embodiment is formed as follows, and a method of manufacturing it will be described with reference to accompanying drawings. FIG. 13 is a flowchart explaining the flow of the method of manufacturing the device. As illustrated in FIGS. 14 and 15, a semiconductor wafer WF is first provided (S 101 in FIG. 13). FIG. 14 is a plan view of the provided semiconductor wafer WF, and FIG. 15 is a sectional view, taken along A-A Line in FIG. 14. As illustrated in FIG. 14, the semiconductor wafer WF has an approximate disk shape and a plurality of chip formation regions CRs are formed in the inner region of the shape, when planarly viewed. The chip formation regions CRs are partitioned from each other by scribe regions each provided between the adjacent chip formation regions CRs. For example, the scribe region SR is formed between the two chip formation regions CRs, as illustrated in FIG. 15; and the bump electrode BMP 1 and bump electrode BMP 2, which are respectively made of, for example, gold films, are formed over the surface of each chip formation region CR. In detail, a so-called pre-process treatment is performed on the provided semiconductor wafer WF; a plurality of semiconductor elements are formed over the semiconductor substrate in each chip formation region CR; and a wiring layer is formed via an interlayer insulating film formed to cover these semiconductor elements. In each chip formation region CR, wiring layers are usually formed in a multilayer pattern, and a passivation film is formed to cover the uppermost layer wiring. An opening is further formed in the passivation film to expose, from the opening, a pad that is part of the uppermost layer wiring. The bump electrode BMP 1 or the bump electrode BMP 2, which is illustrated in FIG. 15, is formed over the pad.

Hereinafter, the pre-process treatment will be briefly described. The semiconductor device is formed over the semiconductor wafer WF. The semiconductor element can be formed by using a manufacturing technique, such as, for example, a film formation technique, etching technique, heat treatment technique, ion implantation technique, photolithography technique, or the like. Examples of the semiconductor device include, for example, a MOSFET (Metal Oxide Semiconductor Field Effect Transistor) and bipolar transistor that are formed over a silicon substrate. Further, a resistance element, capacitative element, or passive element represented by an inductor element is also formed as the semiconductor element.

Subsequently, a wiring layer is formed over the semiconductor wafer over which the semiconductor device is formed. The wiring layer is formed by patterning the metal film formed over the interlayer insulating film. Although the wiring layer usually and mostly has a multilayer wiring structure, but may be a single wiring layer. The wiring that forms the wiring layer is formed, for example, of wiring in which an aluminum film is used or wiring in which a copper film is used (damascene wiring). Thereafter, the passivation film is formed over the uppermost layer wiring layer. The passivation film is one provided for protecting the semiconductor element and wiring layer from a mechanical stress or entry of impurities, and is formed, for example, of a silicon nitride film. The opening is then formed in the passivation film by using a photolithography technique and etching technique, and the pad is formed by exposing part of the uppermost layer wiring from the opening. Thereafter, the bump electrode BMP 1 and bump electrode BMP 2, which are respectively made of gold films, are formed over the pad by using, for example, a plating technique. The semiconductor wafer WF on which a pre-process treatment has been performed can be obtained in the aforementioned way.

Figure 16:
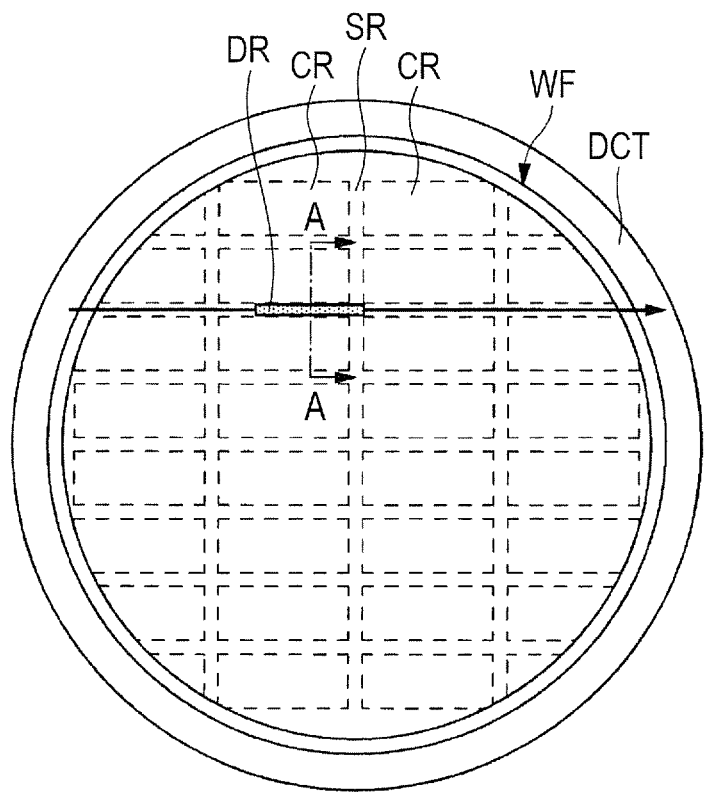
FIG. 16 is a plan view illustrating a step of manufacturing the semiconductor device according to First Embodiment.
Figure 17:
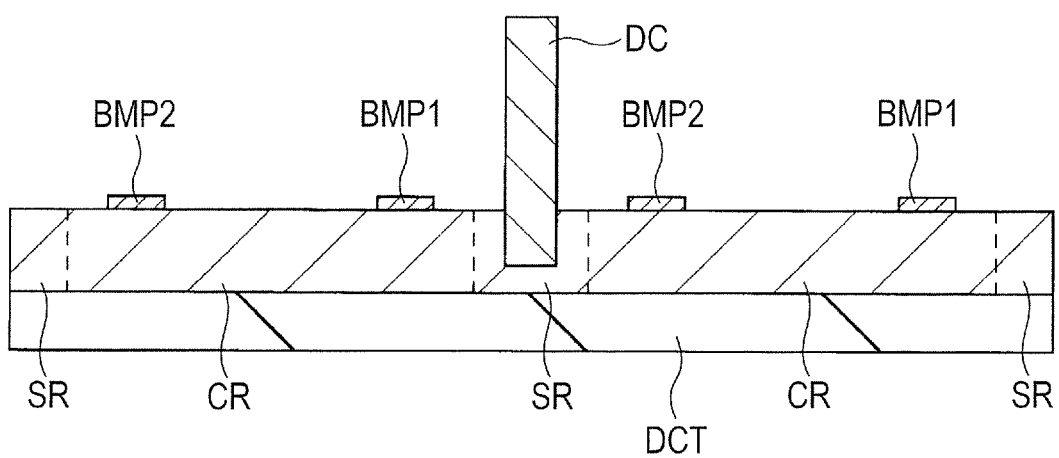
FIG. 17 is a sectional view, taken along A-A Line in FIG. 16.

Subsequently, a dicing tape DCT is attached to the rear surface of the semiconductor wafer WF, as illustrated in FIGS. 16 and 17. Half-cut dicing is performed along the scribe region SR in the semiconductor wafer WF, while the dicing tape DCT is being attached to the rear surface of the semiconductor wafer WF. Specifically, a cut is made in the semiconductor wafer WF by driving a rotating blade (dicer) DC along the scribe region SR from the main surface side of the semiconductor wafer WF, as illustrated in FIG. 16. That is, the scribe region SR, which is sandwiched by the two chip formation regions CRs, is cut to the middle of the thickness of the semiconductor wafer WF (half-cut dicing) by pressing the rotating blade DC against the scribe region, as illustrated in FIG. 17 (S 102 in FIG. 13).

Figure 18:
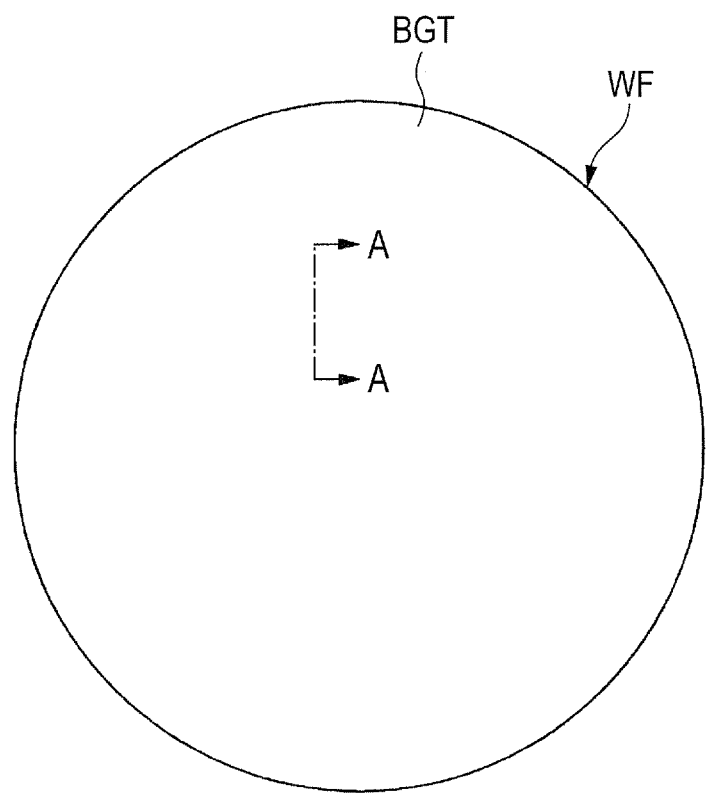
FIG. 18 is a plan view illustrating a step of manufacturing the semiconductor device according to First Embodiment.
Figure 19:
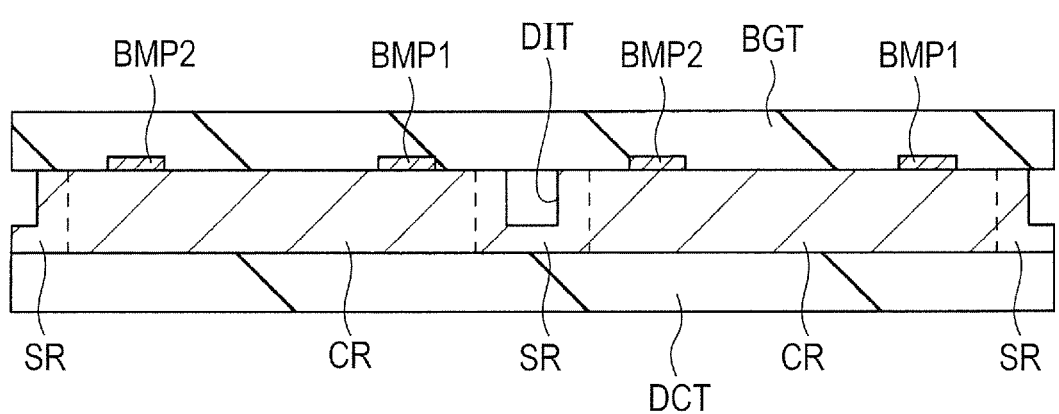
FIG. 19 is a sectional view, taken along A-A Line in FIG. 18.

Subsequently, a back grinding tape BGT is attached to the top surface (main surface) of the semiconductor wafer WF, as illustrated in FIGS. 18 and 19. For example, the back grinding tape BGT is attached so as to cover the top surface (main surface) of the semiconductor wafer WF over which the bump electrode BMP 1 and bump electrode BMP 2 are formed, as illustrated in FIG. 19. Thereby, the top surface (main surface) of the semiconductor wafer WF including the bump electrode BMP 1 and bump electrode BMP 2 is covered with the back grinding tape BGT, and a ditch DIT that is formed in the scribe region SR by the half-cut dicing is also covered with the back grinding tape BGT (S 103 in FIG. 13).

Figure 20:
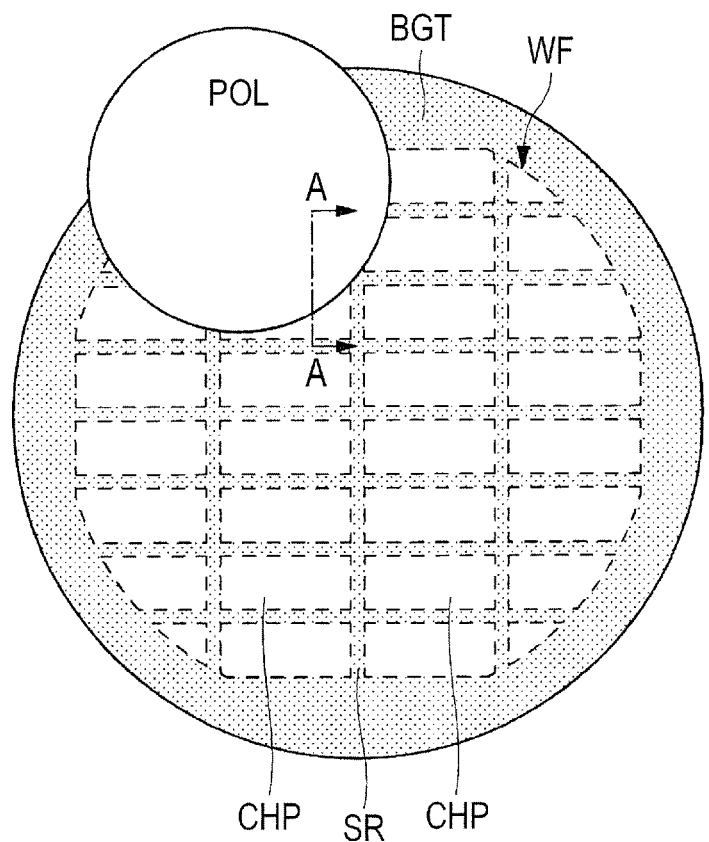
FIG. 20 is a plan view illustrating a step of manufacturing the semiconductor device according to First Embodiment.
Figure 21:
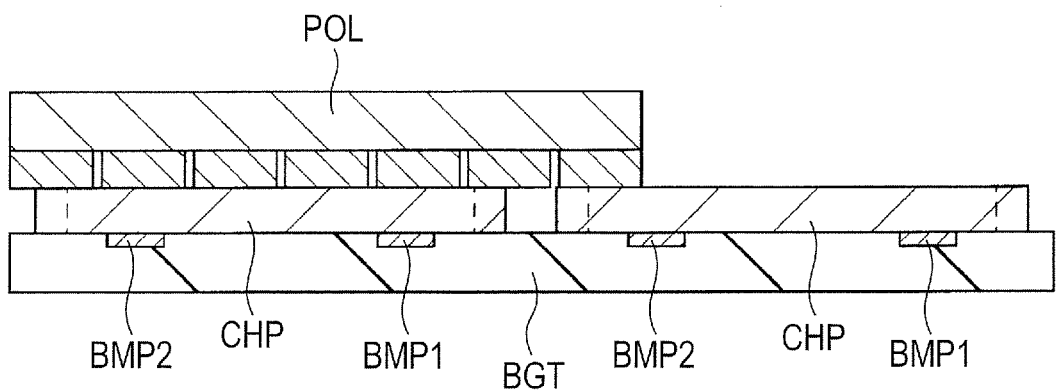
FIG. 21 is a sectional view, taken along A-A Line in FIG. 20.

Subsequently, the semiconductor wafer WF is rearranged such that the back grinding tape BGT is located downward by inverting the wafer WF, as illustrated in FIGS. 20 and 21. Thereby, the dicing tape DCT attached to the rear surface of the semiconductor wafer WF is arranged on the upper surface of the wafer WF. After the dicing tape DCT is peeled off, the rear surface of the semiconductor wafer WF, which is exposed upward, is grinded (back grinding) with a polishing apparatus POL (S 104 in FIG. 13). Thereby, the thickness of the semiconductor wafer WF becomes small, and when the back grinding reaches the ditch formed in the scribe region SR, the semiconductor wafer WF is completely cut by the scribe regions SRs, thereby allowing a plurality of semiconductor chips to be obtained from the semiconductor wafer WF. That is, each chip formation region CR in the semiconductor wafer WF is separated, and the semiconductor chip CHP, corresponding to each chip formation region CR, can be obtained.

Figure 22:
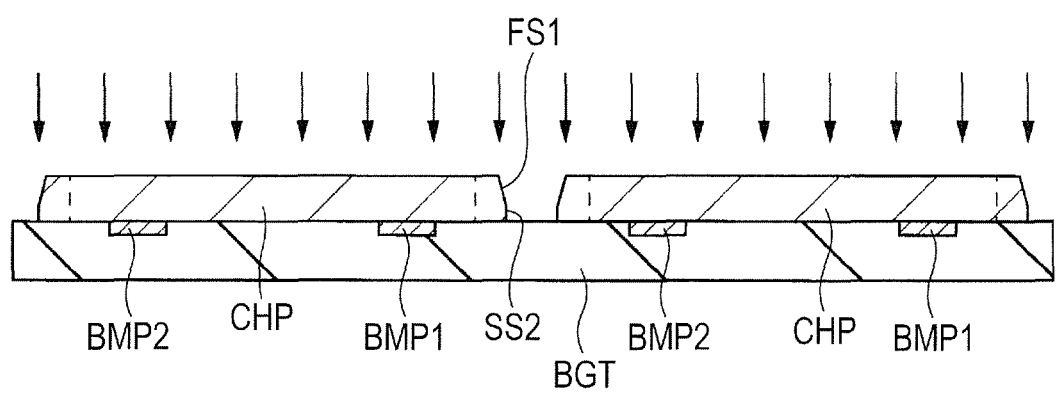
FIG. 22 is a sectional view illustrating a step of manufacturing the semiconductor device following the step in FIG. 21.

Subsequently, plasma etching is performed on the rear surface of the semiconductor chip CHP that is oriented upward, while the semiconductor chips CHPs are being attached to the back grinding tape BGT, as illustrated in FIG. 22 (S 105 in FIG. 13). Thereby, the rear surface and side surface of the semiconductor chip CHP are etched, and in particular, an inclined surface is formed on the side surface of the chip CHP. In this case, the shape of the inclined surface formed on the side surface of the semiconductor chip CHP can be adjusted by adjusting etching conditions represented, for example, by an etching gas concentration or an etching time. Specifically, in this etching process, the chip side surface is formed by both the first side surface area FS 1 having an inclined surface and the second side surface area SS 2 not inclined, as illustrated in FIG. 22, not making the whole chip side surface of the semiconductor chip CHP to be inclined. In this case, when it is assumed that the thickness of the first side surface area FS 1 is A and the thickness of the semiconductor chip CHP is B, it is particularly preferable that the first side surface area FS 1 is formed such that $B/2 \leq A \leq 2B/3$ is satisfied. Alternatively, when it is assumed as stated above, the first side surface area FS 1 may be formed such that $A<B/2$ is satisfied.

Herein, the first side surface area FS 1 is formed nearer to the chip rear surface than to the chip top surface, and the second side surface area SS 2 is formed nearer to the chip top surface than to the chip rear surface. As a result, the corner portion at which the chip side surface and the chip top surface intersect with each other has a perpendicular shape, not an acute angle shape. Therefore, according to First Embodiment, chipping in the semiconductor chip CHP can be prevented.

Figure 23:
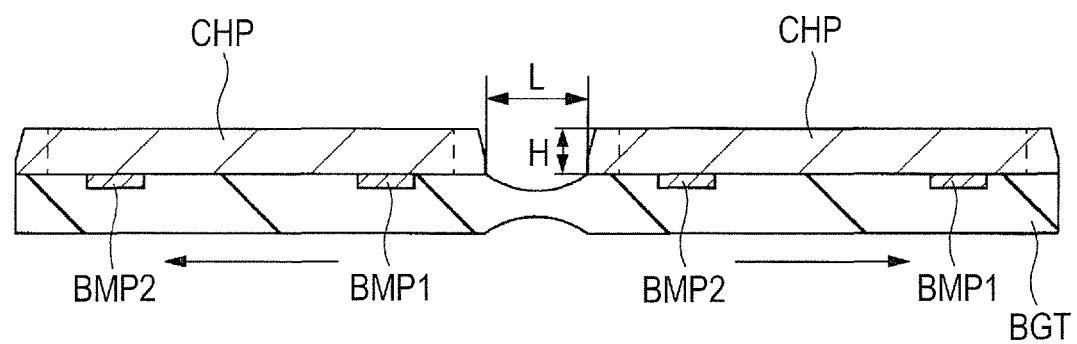
FIG. 23 is a sectional view illustrating a step of manufacturing the semiconductor device following the step in FIG. 22.

Subsequently, the distance between the semiconductor chips CHPs is made large by extending the back grinding tape BGT, as illustrated in FIG. 23. That is, the back grinding tape BGT is formed of a stretchy material, so that a chip space L between the semiconductor chips CHPs can be made large by extending the back grinding tape BGT. As a result, the aspect ratio specified by the chip space L and a chip height H (thickness of the semiconductor chip CHP) can be made small in the semiconductor chip CHP. Thereby, the light-shielding film can be easily formed on the chip side surface of the semiconductor chip CHP.

Figure 24:
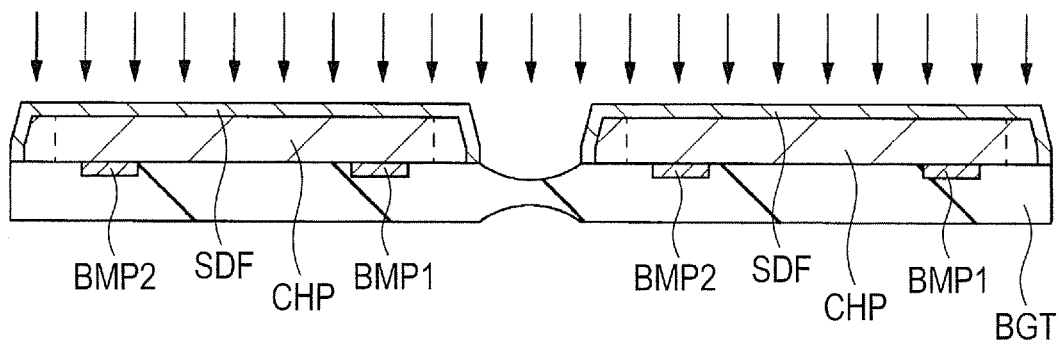
FIG. 24 is a sectional view illustrating a step of manufacturing the semiconductor device following the step in FIG. 23.

Subsequently, the light-shielding film SDF is formed, from the rear surface side (upper surface side) of the semiconductor chip CHP, on the chip rear surface and chip side surface of the chip CHP (S 106 in FIG. 13), as illustrated in FIG. 24. In this case, because the aspect ratio between the semiconductor chips CHPs becomes small in First Embodiment, the light-shielding film SDF can also be easily formed on the chip side surface of the semiconductor chip CHP. As a result, according to First Embodiment, the light-shielding film SDF, having a thickness similar to the thickness by which a light shielding property can be sufficiently exerted, can also be formed on the chip side surface of the semiconductor chip CHP, not only on the chip rear surface thereof. Thereby, the entry of light into the semiconductor chip CHP from the chip side surface can also be effectively suppressed, not only the entry of light thereinto form the chip rear surface.

The light-shielding film SDF illustrated in FIG. 24 can be formed, for example, of a titanium material, such as a titanium film or titanium nitride film, or of a nickel material, such as a nickel film; and can be formed, for example, by a sputtering process. The sputtering process means a process in which: a phenomenon in which, when atoms and ions running at high speed hit a solid material (target), atoms and molecules that form the solid material (target) are sputtered is used; and a film is formed by adhering the sputtered atoms and molecules onto a semiconductor substrate. In the sputtering process, the efficiency of forming a film can be more increased by hitting a solid material (target) with heavier atoms, and hence inert argon (Ar) is typically used as an atom for hitting.

Specifically, in a sputtering apparatus for achieving a sputtering process, a target made of a film formation material (e.g., titanium), and the semiconductor chips CHPs attached to the back grinding tape BGT, which face the target, are arranged in a vacuum chamber whose pressure is reduced. Thereafter, argon gas is introduced into the vacuum chamber such that argon ions (Ar$^+$) are generated by plasma-exciting the introduced argon gas. The generated argon ions hit the target applied with a negative voltage, thereby allowing titanium, which is a film formation material, to be sputtered from the target. As a result, the sputtered titanium is adhered to the chip rear surface and chip side surface of the semiconductor chip CHP. Thus, the light-shielding film SDF can be formed on the chip rear surface and chip side surface of the semiconductor chip CHP.

This sputtering process has the advantage of being excellent in step coverage in comparison with a vacuum deposition process, because s source of supplying titanium is the target surface and titanium flows onto the semiconductor chip CHP from various directions. That is, it can be said that the light-shielding film SDF can be easily formed by the sputtering process, because the process is excellent in a step covering property in comparison with a vacuum deposition process.

However, a method of forming the light-shielding film SDF according to First Embodiment is not particularly limited to the sputtering process, but, for example, a vacuum deposition process can also be used. That is, the light-shielding film SDF made of a titanium material or nickel material can be formed by using a vacuum deposition process. The vacuum deposition process is a process in which a material to be adhered in a vacuum chamber (belljar) is heated to be dissolved and evaporated and the evaporated material is adhered to a semiconductor substrate. According to the vacuum deposition process, a vacuum chamber is used, and hence a material is likely to be evaporated and an influence by the hit with the remaining gas, such as air and vapor, can be made small. Accordingly, the vacuum deposition process has the advantage that a film having a small amount of impurities can be formed.

A CVD (Chemical Vapor Deposition) process can also be used as the method of forming the light-shielding film SDF according to First Embodiment. The CVD process is one for forming a film on a semiconductor substrate by subjecting a material gas (reactive gas) to a chemical reaction in a gas phase. By using the CVD process in which, for example, tungsten hexafluoride (WF$_6$) is used as a material gas, the light-shielding film SDF made of a tungsten film can be formed on the chip rear surface and chip side surface of the semiconductor chip CHP.

The light-shielding film SDF according to First Embodiment can be formed on each of the chip rear surface and chip side surface of the semiconductor chip CHP by using, for example, the sputtering process, vacuum deposition process, or CVD process, as stated above. However, even if any one the processes is used, it becomes difficult to form the light-shielding film SDF on the chip side surface when the aspect ratio (H/L) specified by the chip space L and chip height H (thickness of the semiconductor chip CHP), which are illustrated in FIG. 23, is large.

Accordingly, in First Embodiment, the chip space L is first made large by extending the stretchy back grinding tape BGT, as illustrated in FIG. 23, as a first means for sufficiently forming the light-shielding film SDF on the chip surface. Thereby, the aspect ratio (H/L) specified by the chip space L and the chip height H (thickness of the semiconductor chip CHP) can be made small, according to the First Embodiment. This means that it becomes easy to form the light-shielding film SDF on the chip side surface. That is, the lager the aspect ratio, more difficult the formation of the light-shielding film SDF on the chip side surface, and hence the aspect ratio is made small by making the chip space L to be large with the back grinding tape BGT being extended, in First Embodiment. Accordingly, the advantage that it becomes easy to form the light-shielding film SDF on the chip side surface can be obtained by the first means in First Embodiment. As a result, the light shielding property on the chip side surface can be sufficiently secured.

Also, in First Embodiment, an inclination is provided on the chip side surface by performing plasma etching on each of the chip rear surface and chip side surface of the semiconductor chip CHP, as illustrated in FIG. 22, as a second means for sufficiently forming the light-shielding film SDF on the chip side surface. Thereby, it becomes easy to form the light-shielding film SDF on the chip side surface. That is, in a film formation process represented by the sputtering process, it is generally more difficult to form a film on a horizontal surface (chip rear surface) than on a vertical surface (chip rear surface). Accordingly, in First Embodiment, it is made easy to form the light-shielding film SDF on the chip side surface by providing an inclined surface with the vertical surface, on which it is difficult to form a film, being processed. In First Embodiment, plasma etching is used as a means for providing an inclination on the chip side surface. In this case, the shape of the inclined surface formed on the chip side surface of the semiconductor chip CHP can be adjusted by adjusting etching conditions represented, for example, by an etching gas concentration or an etching time. Specifically, in this etching process, the chip side surface is formed by both the first side surface area FS 1 having an inclined surface and the second side surface area SS 2 not inclined, as illustrated in FIG. 22, not making the whole chip side surface of the semiconductor chip CHP to be inclined. In this case, from the view point of preventing the chipping of the semiconductor chip CHP and forming, onto the chip side surface, the light-shielding film SDF having sufficient film thickness, when it is assumed that the thickness of the first side surface area FS 1 is A and the thickness of the semiconductor chip CHP is B, it is particularly preferable that the first side surface area FS 1 is formed such that $B/2 \leq A \leq 2B/3$ is satisfied. Alternatively, when it is assumed as stated above, the first side surface area FS 1 may be formed such that $A<B/2$ is satisfied.

In First Embodiment, as innovations for making it easy to form the light-shielding film SDF on the chip side surface, the first means by which the aspect ratio is made small by making the chip space L to be large with the back grinding tape BGT being extended, and the second means by which an inclination is provided on the chip side surface by performing plasma etching on each of the chip rear surface and chip side surface of the semiconductor chip CHP, are present. It is, of course, preferable to use the aforementioned first means and second means in combination, from the viewpoint of making it easy to form the light-shielding film SDF on the chip side surface, but not limited thereto. For example, only one of the first means and the second means may be used. That is, one of both the step for extending the back grinding tape BGT and the step for performing plasma etching on each of the chip rear surface and chip side surface of the semiconductor chip CHP can also be omitted. Even in this case, the advantage that the light-shielding film SDF can be sufficiently formed on the chip side surface can be obtained. Also, when the aspect ratio between the semiconductor chips CHPs is sufficiently small with the chip space L between the semiconductor chips CHPs being sufficiently large and with the thickness of the semiconductor chip CHP being small, after the back grinding step illustrated in FIG. 13, the aforementioned first means and second means can be both omitted. Even in this case, the light-shielding film SDF can be sufficiently formed on the chip side surface when the aspect ratio between the semiconductor chips CHPs is small.

Figure 25:
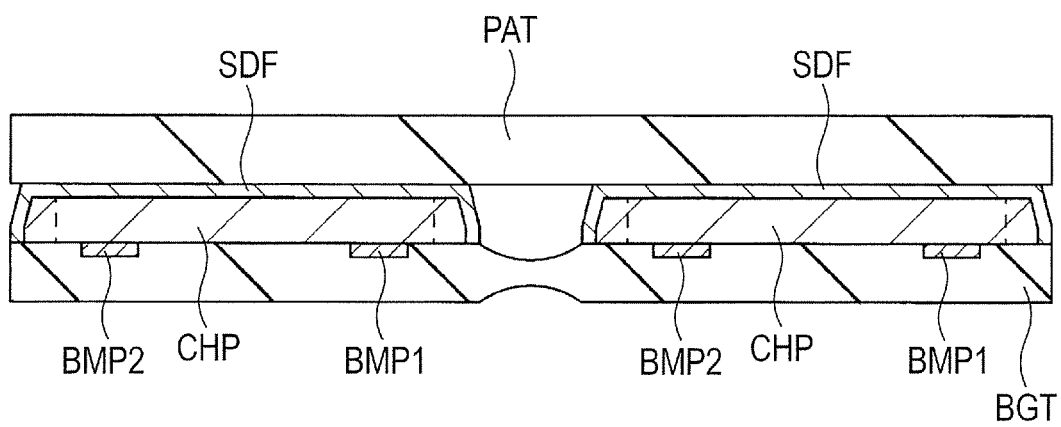
FIG. 25 is a sectional view illustrating a step of manufacturing the semiconductor device following the step in FIG. 24.
Figure 26:
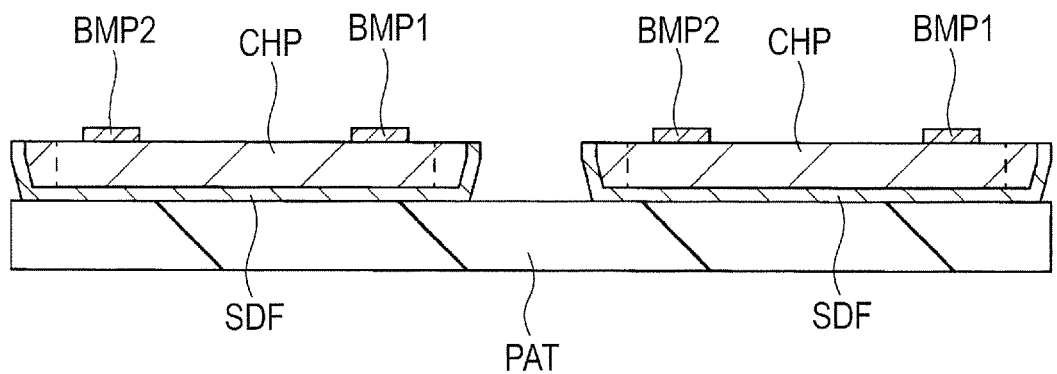
FIG. 26 is a sectional view illustrating a step of manufacturing the semiconductor device following the step in FIG. 25.

Subsequently, a pickup tape PAT is attached to the chip rear surface of the semiconductor chip CHP on which the light-shielding film is formed, as illustrated in FIG. 25. Thereafter, the semiconductor chip CHP is rearranged such that the pickup tape PAT is located downward by inverting the semiconductor chip CHP to which the pickup tape PAT is attached, as illustrated in FIG. 26. Thereby, the back grinding tape BGT, which is attached to the top surface of the semiconductor chip CHP, is arranged on the upper surface of the semiconductor chip CHP. The back grinding tape BGT attached to the chip top surface of the semiconductor chip CHP is then peeled off. As a result, the semiconductor chip CHP is arranged on the pickup tape PAT and the chip top surface of the chip CHP is exposed (S 107 in FIG. 13).

Figure 27:
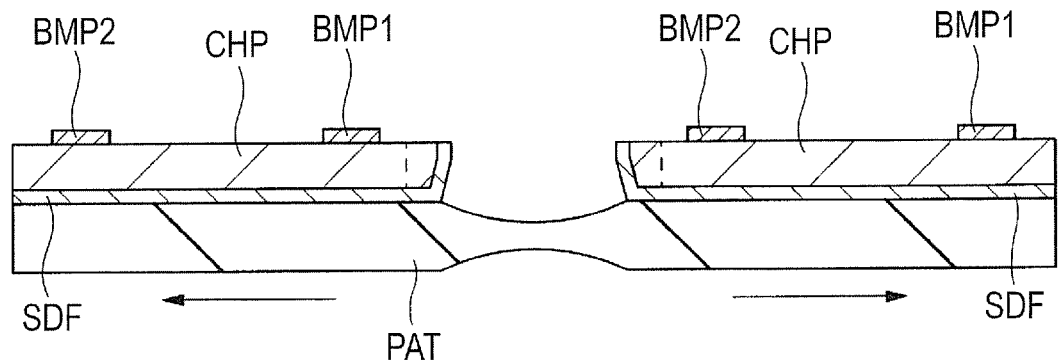
FIG. 27 is a sectional view illustrating a step of manufacturing the semiconductor device following the step in FIG. 26.
Figure 28:
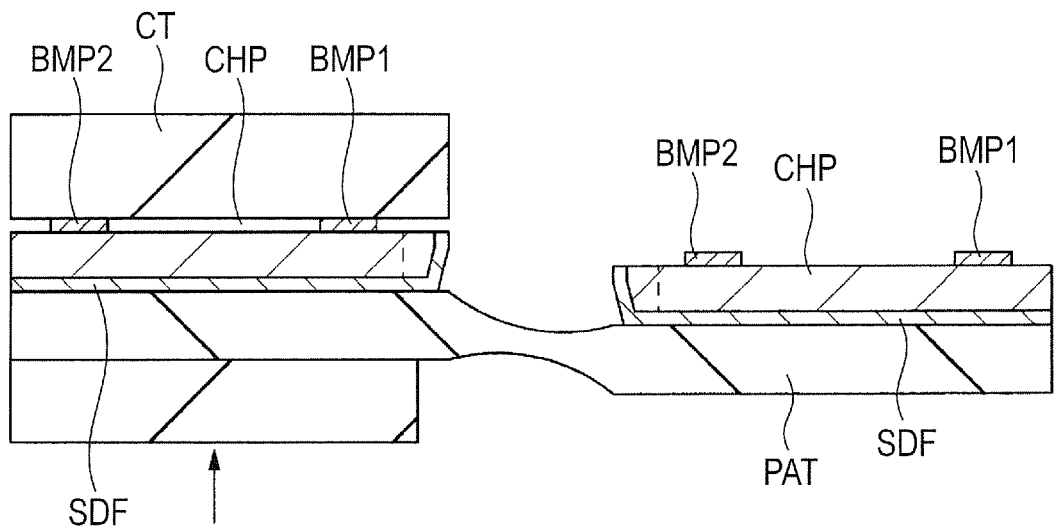
FIG. 28 is a sectional view illustrating a step of manufacturing the semiconductor device following the step in FIG. 27.

The pickup tape PAT is then extended, as illustrated in FIG. 27. Thereby, the chip space between the semiconductor chips CHPs can be made large. Thereafter, as illustrated in FIG. 28, the semiconductor chip CHP attached onto the pickup tape PAT is picked up by, for example, a collet with an inversion mechanism (S 108 in FIG. 13). The semiconductor chip CHP according to First Embodiment can be obtained in the aforementioned way.

<Method of Mounting Semiconductor Device According to First Embodiment>

Figure 29:
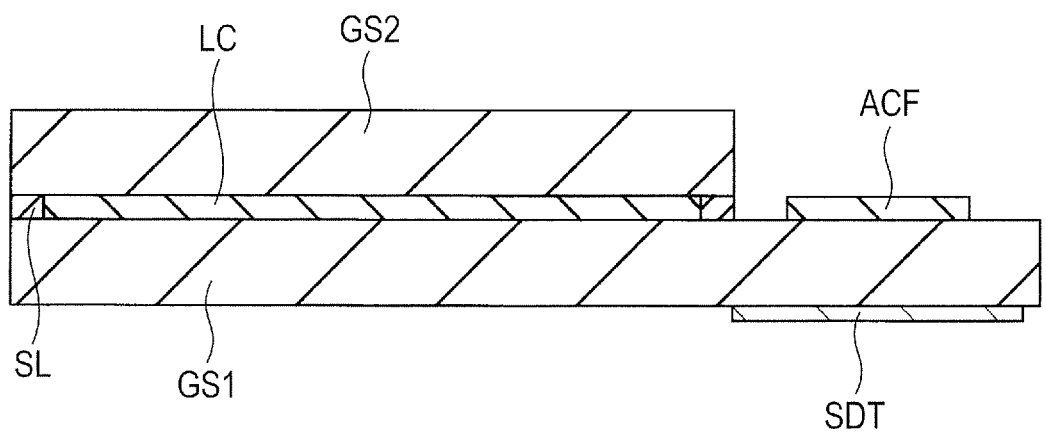
FIG. 29 is a sectional view illustrating a step of mounting the semiconductor device according to First Embodiment.

Subsequently, a method of mounting the semiconductor chip CHP according to First Embodiment over, for example, a glass substrate that is a constituent element of the liquid crystal display. The glass substrate GS 2 is mounted over the glass substrate GS 1 and the liquid crystal member LC is sealed between the two glass substrates, as illustrated in FIG. 29. Thereby, the display unit in the liquid crystal display is formed. A chip-mounting region over which the semiconductor chip CHP, which is the LCD driver, is to be mounted is formed over the glass substrate GS 1 near to the display unit. The light-shielding SDT is attached to the lower surface of the glass substrate GS 1 that is overlapped with the chip-mounting region, when planarly viewed. On the other hand, the anisotropic conductive film ACF is formed in the chip-mounting region over the upper surface of the glass substrate GS 1. The semiconductor chip CHP is mounted over the tip-mounting region over the glass substrate GS 1 thus formed.

Figure 30:
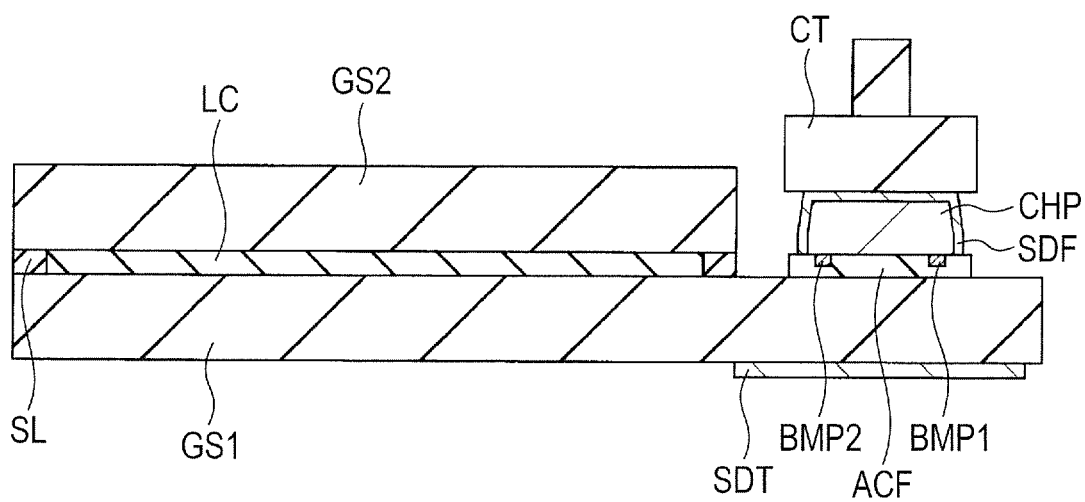
FIG. 30 is a sectional view illustrating a step of mounting the semiconductor device following the step in FIG. 29.

Specifically, FIG. 30 is a sectional view illustrating a step of mounting the semiconductor chip CHP over the glass substrate GS 1. As illustrated in FIG. 30, the semiconductor chip CHP picked up by the collet CT is mounted over the glass substrate GS 1 via the anisotropic conductive film ACF. That is, each of the bump electrode BMP 1 and bump electrode BMP 2 is coupled to the terminal (not illustrated) formed in the glass substrate GS 1 via the anisotropic conductive film ACF. The anisotropic conductive film ACF is a film obtained by mixing fine metal particles into a thermosetting resin and by molding the mixture into a film shape. The metal particle is formed of a sphere having a diameter of 3 μm to 5 μm, in which a nickel layer and a gold plating layer are mainly formed from the inside to the outside and an insulating layer is overlapped with the outermost layer. When the semiconductor chip CHP is mounted over the glass substrate GS 1 in this state, the anisotropic conductive film ACF is sandwiched between the terminal in the glass substrate GS 1 and each of the bump electrode BMP 1 and bump electrode BMP 2 of the semiconductor chip CHP. Thereafter, when a pressure is applied to the semiconductor chip CHP by applying heat with a heater, etc., a pressure is applied only to the portion that is in contact with each of the bump electrode BMP 1 and bump electrode BMP 2. Thereby, the metal particles scattered in the anisotropic conductive film ACF are brought into contact with each other and then overlapped each other and pressed against each other. As a result, a conductive path is formed in the anisotropic conductive film ACF via the metal particles. The metal particle located in a portion of the anisotropic conductive film ACF, where a pressure has not been applied, maintains the insulating layer formed on the surface thereof, and hence the insulation between the metal particle and each of the bump electrode BMP 1 and bump electrode BMP 2 is maintained. Accordingly, short circuit is not caused even if the distance between the metal particle and the bump electrode BMP 1 or bump electrode BMP 2, thereby providing the merit that the semiconductor chip CHP can be mounted over the glass substrate GS 1. Thus, the semiconductor chip CHP can be mounted over the glass substrate GS 1.

<Advantage in First Embodiment>

According to First Embodiment, the light-shielding film SDF is formed on each of the chip rear surface and chip side surface of the semiconductor chip CHP itself, and hence the thinning of the flat display panel can be more promoted than in the case where a light-shielding tape as a separate component is used, while the light incident from the chip side surface or chip rear surface of the semiconductor chip CHP is being suppressed.

(2) Further, according to First Embodiment, the protrusion of the light-shielding tape from the glass substrate GS 2 is suppressed, and hence it becomes difficult that an impact from the outside of the flat panel display may be transmitted to the semiconductor chip CHP. As a result, a crack that may be generated in the semiconductor chip CHP can be suppressed. Thereby, the reliability of the flat panel display can also be improved.

(3) Furthermore, according to First Embodiment, a light-shielding tape as a separate component, which covers each of the chip rear surface and chip side surface, is not used, and hence the cost of the flat panel display can be reduced by the cost for the light-shielding tape.

(4) Still furthermore, according to First Embodiment, it is not needed to separately provide the step for attaching the light-shielding tape that covers the chip rear surface and chip side surface and the protrusion of the light-shielding tape from the glass substrate GS 2 is prevented, and hence, it becomes easy to arrange a touch panel, for example, over the glass substrate GS 2.

(5) Still furthermore, according to First Embodiment, the chip space L is made large by, for example, extending the stretchy back grinding tape BGT, as illustrated in FIG. 23, before the step for forming the light-shielding film SDF on the chip rear surface and chip side surface. Thereby, the aspect ratio (H/L) specified by the chip space L and chip height H (thickness of the semiconductor chip CHP) can be made small. As a result, the light-shielding film SDF can be sufficiently formed on the chip side surface, thereby allowing the light-shielding property on the chip side surface to be improved.

(6) Still furthermore, according to First Embodiment, an inclination is provided on the chip side surface by, for example, performing plasma etching on each of the chip rear surface and chip side surface of the semiconductor chip CHP, as illustrated in FIG. 22, before the step for forming the light-shielding film SDF on both the surfaces of the semiconductor chip CHP. Accordingly, the light-shielding film SDF can be sufficiently formed on the chip side surface, thereby allowing the light-shielding property on the chip side surface to be improved.

(Second Embodiment)

In First Embodiment, it is assumed that the division of the semiconductor wafer WF into the semiconductor chips CHPs by using a combination of the half-cut dicing process and back grinding process is an underlying technique, and examples in which the technical ideas according to First Embodiment are applied to the aforementioned underlying technique have been described. In Second Embodiment, it is assumed that the division of the semiconductor wafer WF into the semiconductor chips CHPs by using a full-cut dicing process is an underlying technique, and examples in which the technical ideas according to First Embodiment are applied to the underlying technique will be described.

Figure 31:
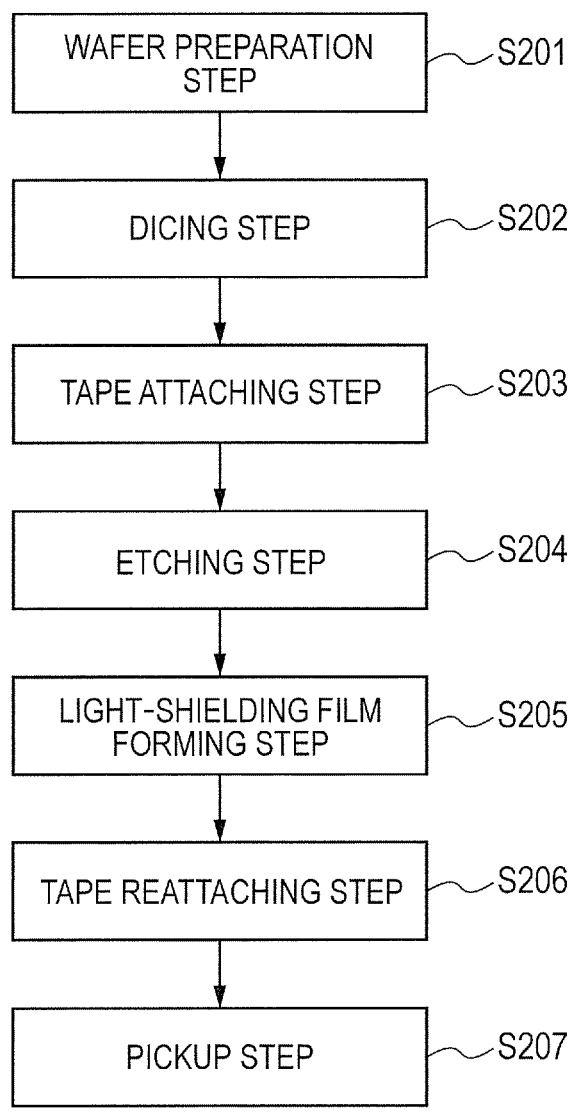
FIG. 31 is a flowchart explaining the flow of a method of manufacturing a semiconductor device according to Second Embodiment.

FIG. 31 is a flowchart illustrating the flow of a method of manufacturing a semiconductor device according to Second Embodiment. Similarly to First Embodiment, a semiconductor wafer on which the pre-process treatment has been performed is first provided (S 201 in FIG. 31). In Second Embodiment, the rear surface of the semiconductor wafer is back grinded in this stage. Thereby, the thickness of the semiconductor wafer can be made small.

Subsequently, the dicing tape DCT is attached to the rear surface of the semiconductor wafer WF, as illustrated in FIG. 32. Full-cut dicing is then performed along the scribe region SR in the semiconductor wafer WF, while the dicing tape DCT is being attached to the rear surface of the semiconductor wafer WF. Specifically, the semiconductor wafer WF is completely cut by driving a rotating blade (dicer) DC along the scribe region SR, as illustrated in FIG. 32. That is, the semiconductor wafer WF is cut (full-cut dicing) by inserting the rotating blade DC (in Second Embodiment, by pressing the blade DC against the rear surface side of the semiconductor wafer WF from the main surface side thereof) into the scribe region SR, which is sandwiched by the two chip formation regions CRs, as illustrated in FIG. 32 (S 202 in FIG. 31). Thereby, the semiconductor wafer WF is divided into a plurality of semiconductor chips.

Subsequently, a tape TP is attached to the top surface (main surface) of the semiconductor chip. For example, the tape TP is attached so as to cover the top surface (main surface) of the semiconductor chip CHP over which the bump electrode BMP 1 and bump electrode BMP 2 are formed, as illustrated in FIG. 33. Thereby, the top surface (main surface) of the semiconductor chip CHP including the bump electrode BMP 1 and bump electrode BMP 2 is covered with the tape TP (S 203 in FIG. 31).

Figure 34:
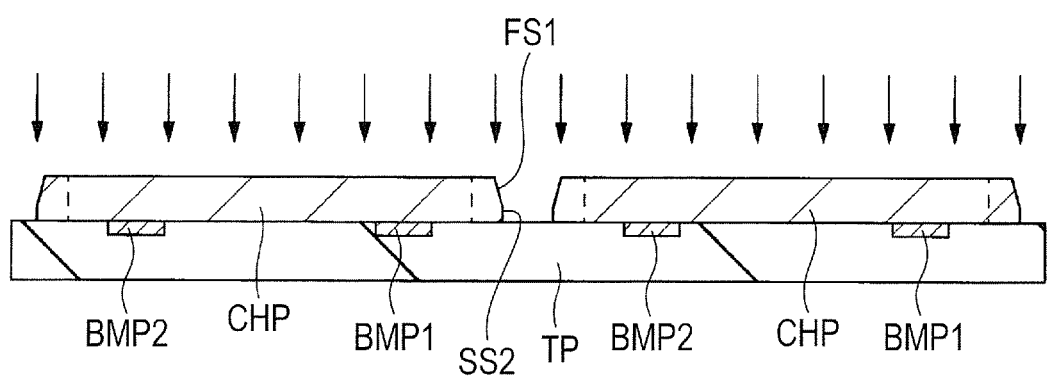
FIG. 34 is a sectional view illustrating a step of manufacturing the semiconductor device following the step in FIG. 33.

Subsequently, the semiconductor chips CHPs are rearranged such that the tape TP is located downward by inverting the tape TP to which the semiconductor chips CHPs are attached. Thereby, the dicing tape DCT attached to the rear surface of the semiconductor chip CHP is arranged on the upper surface of the chip CHP. After the dicing tape DCT is peeled off, the rear surface of the semiconductor chip CHP, which is oriented upward, is subjected to plasma etching, while the tape TP is being attached to the semiconductor chips CHPs, as illustrated in FIG. 34 (S 204 in FIG. 31). Thereby, the rear surface and side surface of the semiconductor chip CHP are etched, and in particular, an inclined surface is formed on the side surface thereof. In this case, the shape of the inclined surface formed on the side surface of the semiconductor chip CHP can be adjusted by adjusting etching conditions represented, for example, by an etching gas concentration or an etching time. Specifically, in this etching process, the chip side surface is formed by both the first side surface area FS 1 inclined with respect to the chip rear surface of the semiconductor chip CHP and the second side surface area SS 2 not inclined, as illustrated in FIG. 22, not making the whole chip side surface of the semiconductor chip CHP to be inclined. In this case, when it is assumed that the thickness of the first side surface area FS 1 is A and the thickness of the semiconductor chip CHP is B, it is particularly preferable that the first side surface area FS 1 is formed such that $B/2 \leq A \leq 2B/3$ is satisfied. Alternatively, when it is assumed as stated above, the first side surface area FS 1 may be formed such that $A<B/2$ is satisfied.

Herein, the first side surface area FS 1 is formed nearer to the chip rear surface than to the chip top surface, and the second side surface area SS 2 is formed nearer to the chip top surface than to the chip rear surface. As a result, the corner portion at which the chip side surface and the chip top surface intersect with each other has a perpendicular shape, not an acute angle shape. Therefore, chipping in the semiconductor chip CHP can be prevented also by Second Embodiment.

The following steps are similar to those in First Embodiment. The outline of the following steps can be described, for example, as follows: after the chip space between the semiconductor chips is made large by extending the tape, a light-shielding film is formed, from the rear surface (upper surface) side of the semiconductor chip, on each of the chip rear surface and chip side surface of the semiconductor chip (S 205 in FIG. 31). Similarly to First Embodiment, for example, a titanium material or nickel material that is formed by a sputtering process or vacuum deposition process, or a tungsten film formed by a CVD process, can be used as the light-shielding film.

Subsequently, a pickup tape is attached to the chip rear surface of the semiconductor chip on which the light-shielding film is formed. Thereafter, the semiconductor chip is rearranged such that the pickup tape is located downward by inverting the semiconductor chip to which the pickup tape is attached. Thereby, the tape attached to the top surface of the semiconductor chip is arranged on the upper surface of the semiconductor chip. The tape attached to the chip top surface of the semiconductor chip is then peeled off. As a result, the semiconductor chip is arranged on the pickup tape and the chip top surface of the chip is exposed (S 206 in FIG. 31).

The pickup tape is then extended. Thereby, the chip space between the semiconductor chips can be made large. Thereafter, the semiconductor chip attached onto the pickup tape is picked up by, for example, a collet with an inversion mechanism (S 207 in FIG. 31). The semiconductor chip according to Second Embodiment can be obtained in the aforementioned way. The obtained semiconductor chip is mounted over the glass substrate that forms the display device (COG (Chip on Glass) in a way similar to that in First Embodiment. In this case, advantages similar to those in First Embodiment can also be obtained in Second Embodiment.

(First Variation)

A semiconductor wafer is divided into a plurality of semiconductor chips, for example, by a process similar to that in First Embodiment, i.e., by a combination of a half-cut dicing process and a back grinding process. Thereafter, the chip rear surface and chip side surface of the semiconductor chip can also be wet-etched by using an etching liquid, such as hydrofluoric acid, while the semiconductor chip is being attached to a back grinding tape. Also, in this case, an inclined surface is formed on the chip side surface of the semiconductor chip. Similarly, a semiconductor wafer is divided into a plurality of semiconductor chips by a process similar to that in Second Embodiment, i.e., by a full-cut dicing process. Thereafter, the chip rear surface and chip side surface of the semiconductor chip can also be wet-etched by using an etching liquid, such as hydrofluoric acid, while the semiconductor chip is being attached to a tape. Also, in this case, an inclined surface is formed on the chip side surface of the semiconductor chip. As stated above, wet-etching with the use of an etching liquid can also be adopted instead of the plasma etching used in First Embodiment and Second Embodiment. Also, in this case, an inclined surface can be provided on the chip side surface of the semiconductor chip. In the case of this wet-etching, the shape of the inclined surface to be formed on the chip surface can also be adjusted by adjusting etching conditions represented by a composition of the etching liquid and an etching time. Advantages similar to those in First Embodiment can also be obtained in First Variation.

(Second Variation)

In First Embodiment and Second Embodiment, examples have been described, in each of which an inclined surface is formed on the chip side surface of the semiconductor chip by performing an etching treatment after a semiconductor wafer is divided into a plurality of semiconductor chips. In Second Variation, an example will be described, in which an etching treatment is performed on a semiconductor wafer in a state before the semiconductor wafer is not divided into a plurality of the semiconductor chips.

Also, in Second Variation, a semiconductor wafer on which a pre-process treatment has been performed is first provided. The rear surface of the semiconductor wafer is then back grinded. Thereby, the thickness of the semiconductor wafer can be made small.

Figure 35:
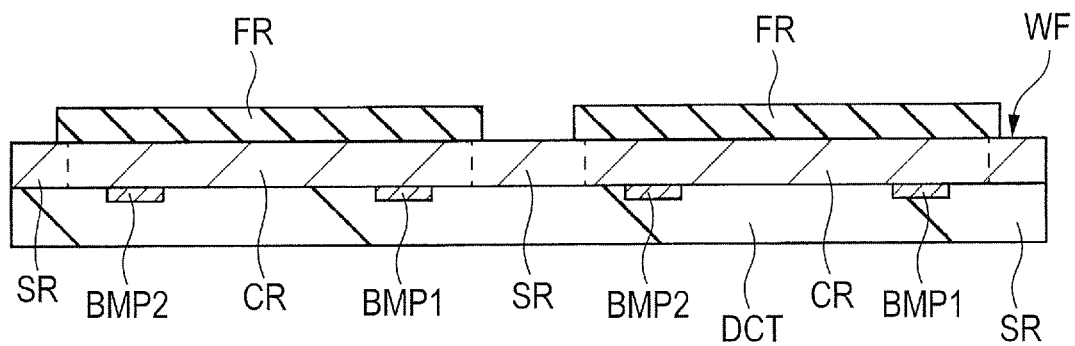
FIG. 35 is a sectional view illustrating a step of manufacturing a semiconductor device according to Variation 2.

Subsequently, the dicing tape DCT is attached to the main surface (top surface) of the semiconductor wafer WF, as illustrated in FIG. 35. The semiconductor wafer WF is arranged in a state where the side of the main surface (top surface) over which the bump electrode BMP 1 and bump electrode BMP 2 are formed is oriented downward. Accordingly, the rear surface of the semiconductor wafer WF is exposed in the state of being oriented upward. Thereafter, a resist film FR is coated onto the rear surface of the semiconductor wafer WF, the rear surface being oriented upward, and exposure/development treatments are performed on the resist film FR, thereby allowing patterning to be performed on the resist film FR. The patterning of the resist film FR is performed such that part of each scribe region SR is at least opened. The patterning of the resist film FR is not limited thereto, but may be performed such that the whole of each scribe region SR is opened, or further, may be performed such that each of the scribe regions SR is exposed and an opening enters the chip formation region CR from the boundary with the region CR. That is, the patterning of the resist film FR may be performed such that approximately 90% of each chip formation region CR is covered, or may be performed such that each chip formation region CR is covered and at least part of each of the scribe regions SRs is opened.

Figure 36:
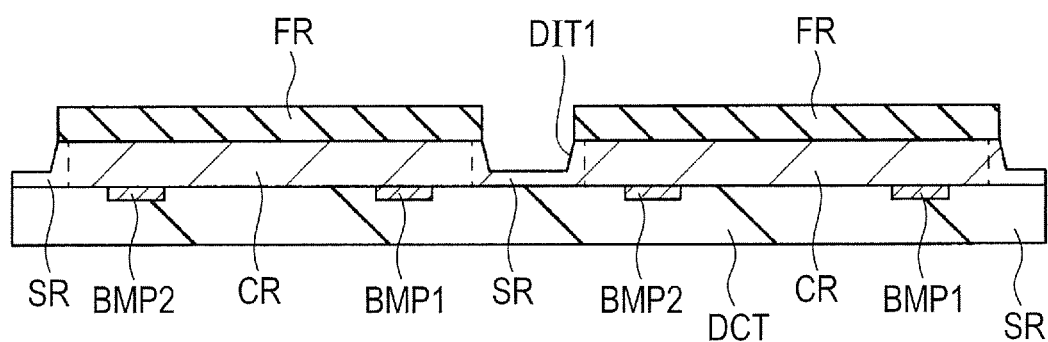
FIG. 36 is a sectional view illustrating a step of manufacturing the semiconductor device following the step in FIG. 35.

Subsequently, an etching treatment is performed by using the patterned resist film FR as a mask, as illustrated in FIG. 36. Thereby, the ditch DIT 1 whose side surface is inclined can be formed in the scribe region SR in the semiconductor wafer WF. That is, in Second Variation, the ditch DIT 1 whose side surface is inclined is formed in the scribe region SR by etching, with the use of, for example, plasma etching or chemical dry etching, the semiconductor wafer WF such that the thickness of the etched wafer WF becomes approximately ⅔ times the original thickness thereof.

Figure 37:
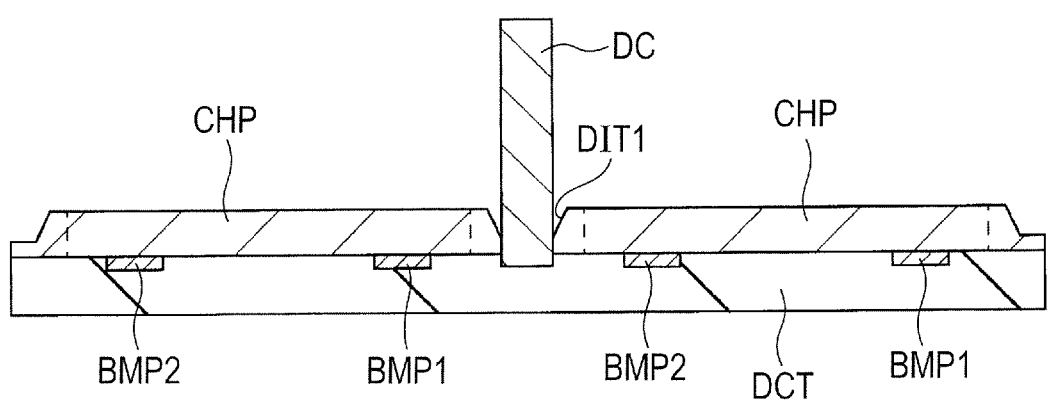
FIG. 37 is a sectional view illustrating a step of manufacturing the semiconductor device following the step in FIG. 36.

Subsequently, full-cut dicing is performed along the bottom surface of the ditch DIT 1 formed inside the scribe region SR in the semiconductor wafer WF, as illustrated in FIG. 37. Specifically, the semiconductor wafer WF is completely cut by driving, from the rear surface side of the semiconductor wafer WF, the rotating blade (dicer) DC along the ditch DIT 1, as illustrated in FIG. 37. That is, the semiconductor wafer WF is cut (full-cut dicing) by pressing the rotating blade DC against the scribe region SR sandwiched between the two chip formation regions CRs, as illustrated in FIG. 37. Thereby, the semiconductor wafer WF is divided into a plurality of semiconductor chip CHPs.

As a result, according to Second Variation, the chip side surface is formed by both the ditch DIT 1 (first side surface area) having an inclined surface and a side surface area not inclined, which is the cut surface generated by the dicing, as illustrated in FIG. 37, not making the whole chip side surface to be inclined. In this case, the shape of the chip side surface can be adjusted by adjusting the depth of the ditch DIT 1. That is, the shape of the ditch DIT 1 can be controlled by adjusting the etching conditions of the etching treatment for forming the ditch DIT 1. Thereby, the ratio of the ditch DIT 1 (first side surface area) and the side surface area, which is the cut surface of the dicing, can be adjusted. Thereby, when it is assumed that the depth of the ditch DUT 1 (first side surface area) is A and the thickness of the semiconductor chip CHP is B, the ditch DIT 1 can also be formed in Second Variation, so that $B/2 \leq A \leq 2B/3$ is satisfied, or so that $A<B/2$ is satisfied.

The following steps are similar to those in First Embodiment and Second Embodiment. The semiconductor chip according to Second Variation can be formed in the aforementioned way. Further, the obtained semiconductor chip according to Second Variation can be mounted over a glass substrate. In this case, advantages similar to those in First Embodiment can also be obtained in Second Variation.

(Third Variation)

In Third variation, an example will be described, in which a step-cut process for performing dicing in two stages is used. Also, in Third Variation, a semiconductor wafer on which a pre-process treatment has been performed is first provided. The rear surface of the semiconductor wafer is then back grinded. Thereby, the thickness of the semiconductor wafer can be made small.

Figure 38:
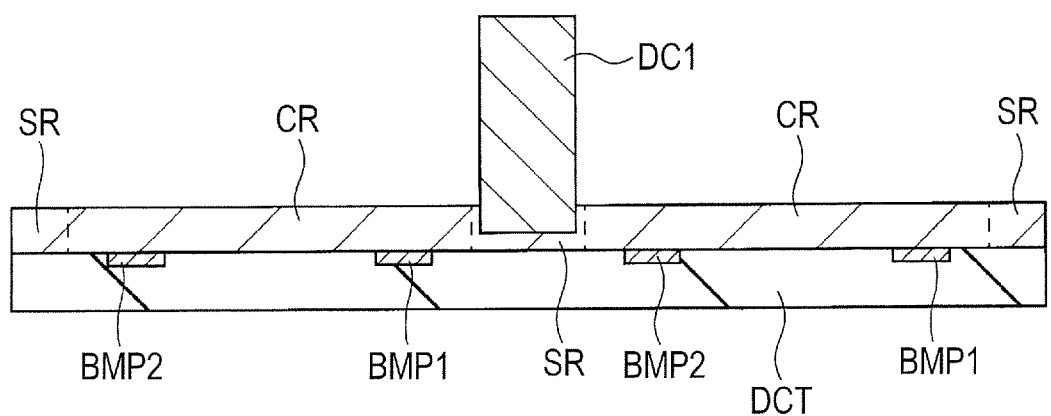
FIG. 38 is a sectional view illustrating a step of manufacturing a semiconductor device according to Variation 3.

Subsequently, the dicing tape DCT is attached to the main surface (top surface) of the semiconductor wafer WF, as illustrated in FIG. 38. The semiconductor wafer WF is arranged in a state where the side of the main surface (top surface) over which the bump electrode BMP 1 and bump electrode BMP 2 are formed is oriented downward. Accordingly, the rear surface of the semiconductor wafer WF is exposed in the state of being oriented upward.

Figure 39:
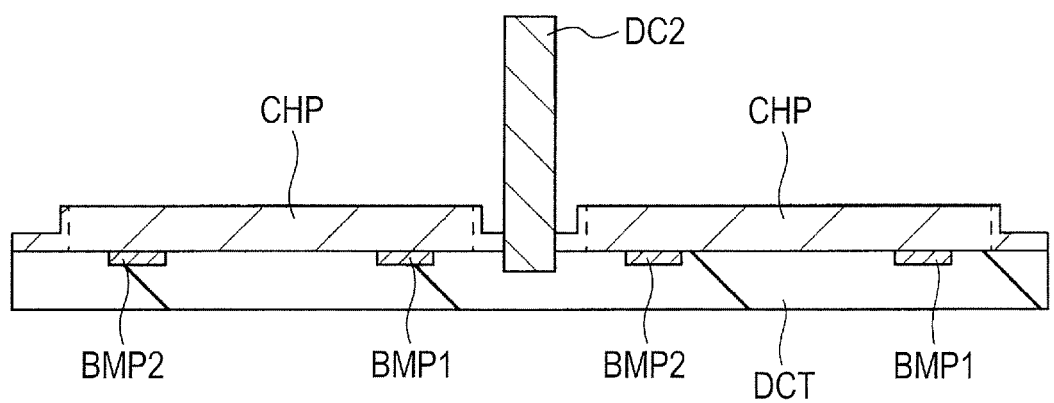
FIG. 39 is a sectional view illustrating a step of manufacturing the semiconductor device following the step in FIG. 38.

Subsequently, half-cut dicing is performed, from the rear surface of the semiconductor wafer, along the scribe region SR such that the thickness of the etched wafer becomes approximately ⅔ times the original thickness thereof. In this case, the thickness of the used blade DC 1 becomes relatively large. After the half-cut dicing is completed, dicing is performed to completely cut the semiconductor wafer WF by using, for example, a blade DC 2 having a thickness smaller than that of the blade DC 1, as illustrated in FIG. 39. That is, the rotating blade DC 2 is driven, from the rear surface of the semiconductor wafer, along the cut formed in the scribe region SR by the half-cut dicing. Thereby, the semiconductor wafer WF is completely cut and divided into a plurality of the semiconductor chips CHPs.

Thus, the semiconductor wafer WF is cut by two types of blades each having a thickness different from the other, according to Third Variation, and hence a step is formed on the side surface of the semiconductor chip CHP that is individually separated. As a result, it becomes easy to form a light-shielding film on the chip side surface of the semiconductor chip CHP. Alternatively, a V-shaped blade can be used as the blade DC 1 to be used for the half-cut dicing. In this case, an inclined surface is formed on the chip side surface, and hence it further becomes easy to form a light-shielding film on the chip side surface.

The following steps are similar to those in First Embodiment and Second Embodiment. The semiconductor chip according to Third Variation can be formed in the aforementioned way. Further, the obtained semiconductor chip according to Third Variation can be mounted over a glass substrate. In this case, advantages similar to those in First Embodiment can also be obtained in Third Variation.

The invention made by the present inventors has been described in detail above based on preferred embodiments; however, it is needless to say that the invention is not limited to the embodiments and can be variously modified within the scope not departing from the gist of the invention.

This invention is widely applied to the manufacturing industry manufacturing semiconductor devices.

What is claimed is:

1. A semiconductor device including a semiconductor chip to be mounted over a substrate arranged in a case having a light source,
    wherein the semiconductor chip includes: (a) a chip top surface above the light source; (b) a plurality of bump electrodes formed under the chip top surface; (c) a chip rear surface opposite to the chip top surface and above the chip top surface; (d) a chip side surface located between the chip top surface and the chip rear surface, and
    wherein a light-shielding film is formed over both the chip rear surface and the entire chip side surface, and
    wherein the width of the chip rear surface is smaller than that of the chip top surface,
    wherein the chip side surface of the semiconductor chip is formed by both a first side surface area formed nearer to the chip rear surface than to the chip top surface and a second side surface area formed nearer to the chip top surface than to the chip rear surface, and
    wherein the first side surface area is an inclined surface inclined relative to the second side surface area,
    wherein, when it is assumed that the thickness of the first side surface area is A and the thickness of the semiconductor chip is B, $B/2 \leq A \leq 2B/3$ is satisfied,
    wherein the light-shielding film is formed over both the chip rear surface and the entire chip side surface to contact both the chip rear surface and the chip side surface without contacting the substrate.

2. A semiconductor device according to claim 1,
    wherein the semiconductor chip is an LCD driver for driving an liquid crystal display unit in a liquid crystal display.

3. A liquid crystal display comprising:
    (a) a first substrate having an upper surface and a lower surface opposite to the upper surface;
    (b) a liquid crystal member arranged over the upper surface of the first substrate;
    (c) a second substrate arranged so as to seal the liquid crystal member by a combination with the first substrate;
    (d) a light source arranged in the lower portion of the first substrate; and
    (e) a semiconductor chip having: a chip top surface above the light source; a plurality of bump electrodes formed under the chip top surface; a chip rear surface opposite to the chip top surface and above the chip top surface; and a chip side surface located between the chip top surface and the chip rear surface, in which the chip top surface is arranged over the upper surface of the first substrate so as to face the upper surface of the first substrate,
    wherein a sealing member is formed between the chip top surface of the semiconductor chip and the upper surface of the first substrate, and
    wherein a light-shielding film is formed over both the chip rear surface and the entire chip side surface of the semiconductor chip, and
    wherein the width of the chip rear surface is smaller than that of the chip top surface,
    wherein the chip side surface of the semiconductor chip is formed by both a first side surface area formed nearer to the chip rear surface than to the chip top surface and a second side surface area formed nearer to the chip top surface than to the chip rear surface, and
    wherein the first side surface area is an inclined surface inclined relative to the second side surface area,
    wherein, when it is assumed that the thickness of the first side surface area is A and the thickness of the semiconductor chip is B, $B/2 \leq A \leq 2B/3$ is satisfied,
    wherein the light-shielding film is formed over both the chip rear surface and the entire chip side surface to contact both the chip rear surface and the chip side surface without contacting the first substrate.

* * * * *